United States Patent
Zundel et al.

(10) Patent No.: US 9,343,381 B2
(45) Date of Patent: May 17, 2016

(54) SEMICONDUCTOR COMPONENT WITH INTEGRATED CRACK SENSOR AND METHOD FOR DETECTING A CRACK IN A SEMICONDUCTOR COMPONENT

(71) Applicant: Infineon Technologies AG, Neubiberg (DE)

(72) Inventors: Markus Zundel, Egmating (DE); Uwe Schmalzbauer, Siegertsbrunn (DE); Rudolf Zelsacher, Klagenfurt (AT)

(73) Assignee: Infineon Technologies AG, Neibiberg (DE)

( * ) Notice: Subject to any disclaimer, the term of this patent is extended or adjusted under 35 U.S.C. 154(b) by 123 days.

(21) Appl. No.: 13/899,906

(22) Filed: May 22, 2013

(65) Prior Publication Data

US 2014/0346509 A1    Nov. 27, 2014

(51) Int. Cl.
*H01L 27/14* (2006.01)
*H01L 21/66* (2006.01)
*H01L 23/00* (2006.01)

(52) U.S. Cl.
CPC ............ *H01L 22/32* (2013.01); *H01L 22/34* (2013.01); *H01L 22/14* (2013.01); *H01L 24/06* (2013.01); *H01L 24/32* (2013.01); *H01L 2224/0603* (2013.01); *H01L 2224/06181* (2013.01); *H01L 2224/32245* (2013.01); *H01L 2924/12036* (2013.01); *H01L 2924/1301* (2013.01); *H01L 2924/1305* (2013.01); *H01L 2924/13055* (2013.01); *H01L 2924/13091* (2013.01)

(58) Field of Classification Search
CPC ............ H01L 2924/12036; H01L 2924/1301; H01L 2924/1305; H01L 2924/13055; H01L 2924/13091; B82Y 10/00; B82Y 15/00; G01N 27/414; B81C 1/00246; G01P 15/0802
See application file for complete search history.

(56) References Cited

U.S. PATENT DOCUMENTS

| | | | | |
|---|---|---|---|---|
| 6,097,103 | A | * | 8/2000 | Ishigaki ........................ 257/776 |
| 2005/0275076 | A1 | * | 12/2005 | Sugiura et al. ................ 257/678 |
| 2008/0035923 | A1 | | 2/2008 | Tschmelitsch et al. |

* cited by examiner

*Primary Examiner* — Su C Kim
(74) *Attorney, Agent, or Firm* — Murphy, Bilak & Homiller, PLLC

(57) ABSTRACT

A first embodiment relates to a semiconductor component. The semiconductor component has a semiconductor body with a bottom side and a top side spaced distant from the bottom side in a vertical direction. In the vertical direction, the semiconductor body has a certain thickness. The semiconductor component further has a crack sensor configured to detect a crack in the semiconductor body. The crack sensor extends into the semiconductor body. A distance between the crack sensor and the bottom side is less than the thickness of the semiconductor body.

18 Claims, 20 Drawing Sheets

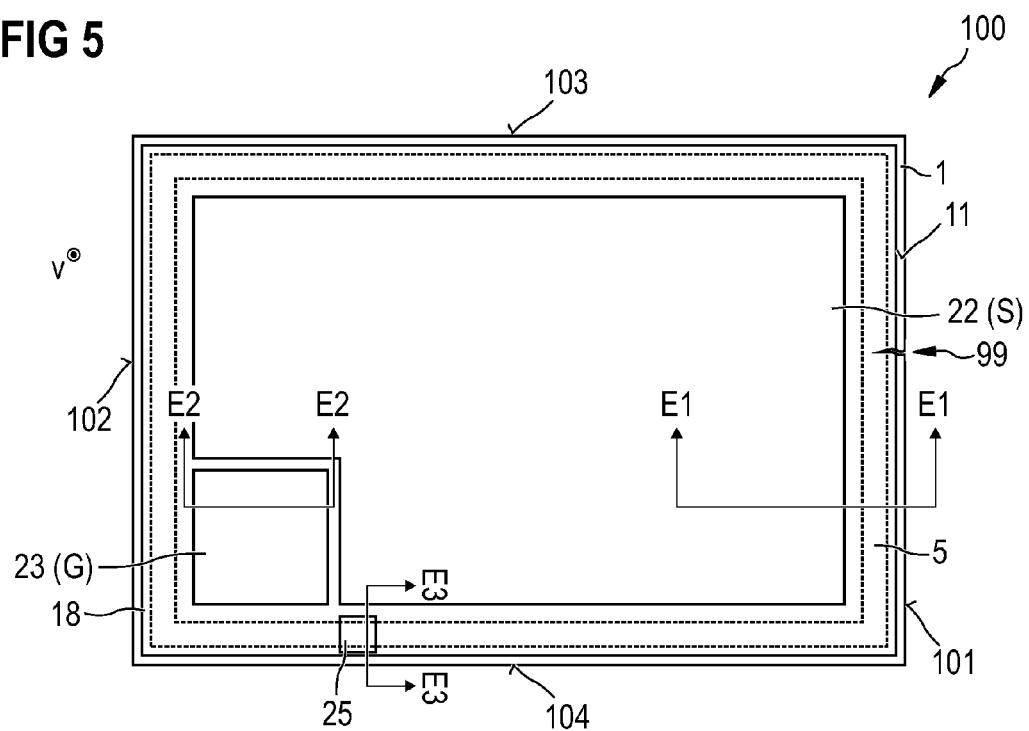

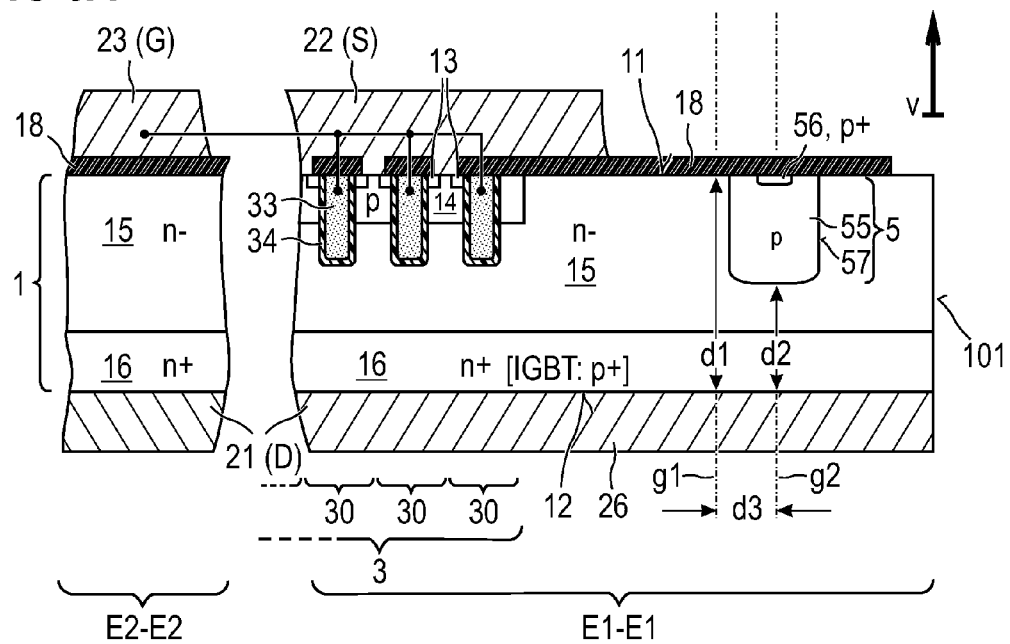
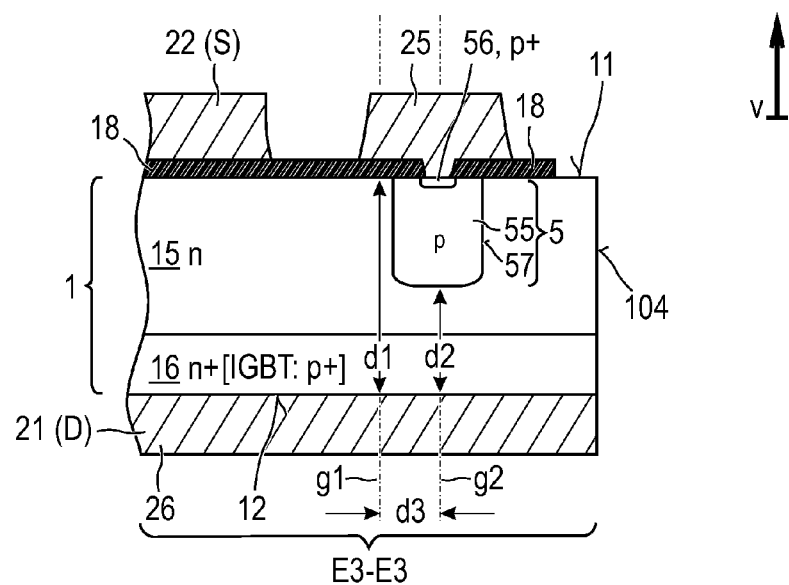

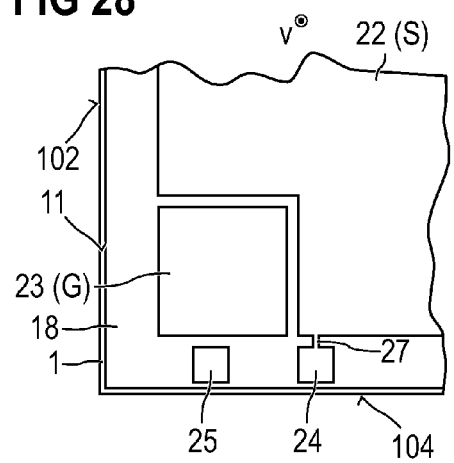
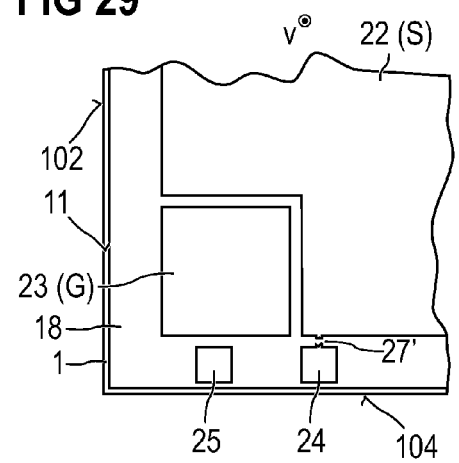
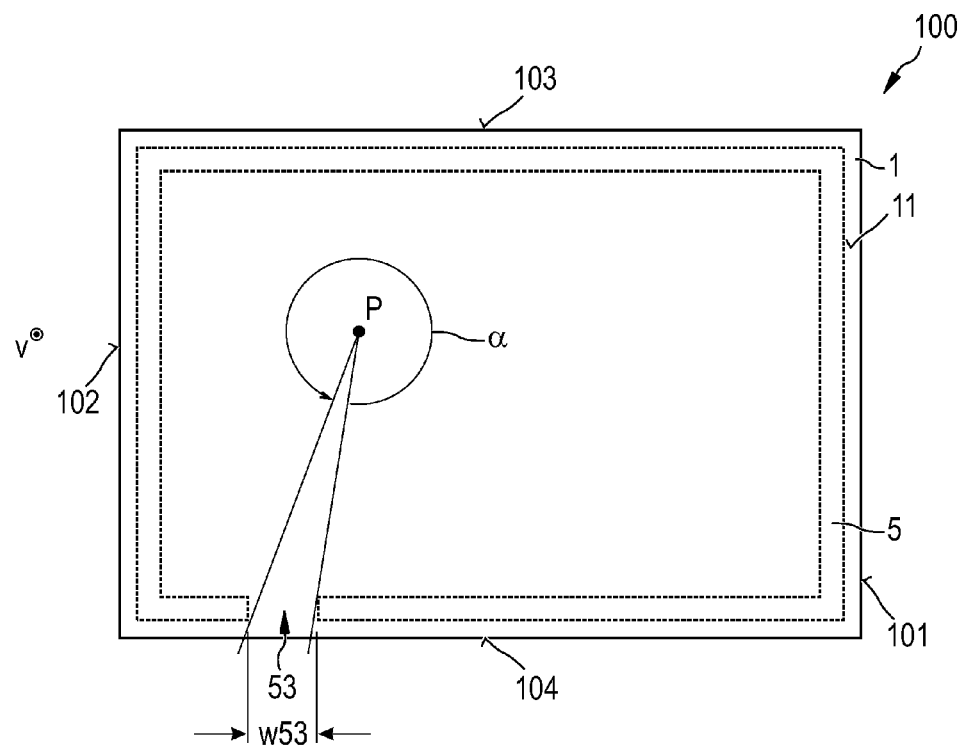

FIG 36

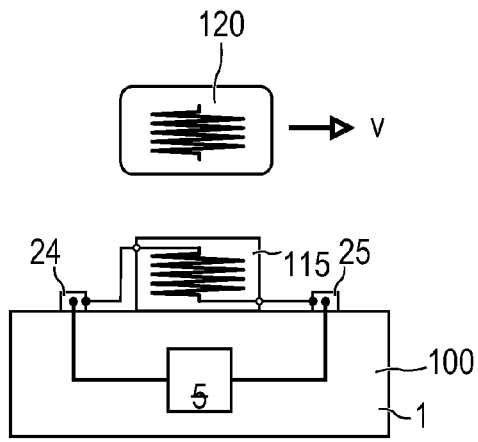

FIG 37

| Providing a semiconductor component (100) with<br><br>— a semiconductor body (1) comprising a bottom side (12), a top side (11) spaced distant from the bottom side (1) in a vertical direction (v), and, in the vertical direction (v), a thickness (d1); and<br>— a crack sensor (5) for detecting the occurrence of a crack (99) in the semiconductor body (1), wherein the crack sensor (5) extends into the semiconductor body (1), and wherein a distance (d2) between the crack sensor (5) and the bottom side (12) is less than the thickness (d1) of the semiconductor body (1); | ~201 |
|---|---|
| Specifying a first value of a characteristic variable of the crack sensor (5); | ~202 |
| Determining, prior to or after specifying the first value, a second value of the characteristic variable of the crack sensor (5); | ~203 |
| Identifying the semiconductor body (1) to have a crack (99) if the second value differs from the first value by more than a pre-defined difference. | ~204 |

# SEMICONDUCTOR COMPONENT WITH INTEGRATED CRACK SENSOR AND METHOD FOR DETECTING A CRACK IN A SEMICONDUCTOR COMPONENT

TECHNICAL FIELD

Embodiments of the present invention relate to a semiconductor component with integrated crack sensor.

BACKGROUND

In general, any semiconductor component, for instance a diode, or a transistor such as an IGFET (Insulated Gate Field Effect Transistor) like a MOSFET (Metal Oxide Field Effect Transistor) or an IGBT (Insulated Gate Bipolar Transistor) has a semiconductor body. During the production and/or the operation of the semiconductor component, cracks can occur and propagate in the semiconductor body. For instance, if a number of semiconductor components are produced in a common wafer and subsequently separated from one another (i.e. singulated) e.g. by dicing or other techniques, such cracks can emanate from the separation line. Also mechanical strain, for instance caused by different CTEs (CTE=Coefficient of Thermal Expansion) of different materials used in a semiconductor component or by different CTEs of the semiconductor component and a substrate carrying the semiconductor component can lead to cracks in the semiconductor component.

Due to such a crack, a semiconductor component may be defective as soon as the crack occurs, or become defective over the course of time as the crack propagates in the semiconductor body. Hence, there is a need for avoiding problems caused by cracks in a semiconductor component.

SUMMARY

A semiconductor component has a semiconductor body with a bottom side and a top side spaced distant from the bottom side in a vertical direction. In the vertical direction, the semiconductor body has a certain thickness. The semiconductor component further has a crack sensor configured to detect a crack in the semiconductor body. The crack sensor extends into the semiconductor body. A distance between the crack sensor and the bottom side is less than the thickness of the semiconductor body.

In a method for detecting a crack in a semiconductor component, a semiconductor component is provided. The semiconductor component has a semiconductor body with a bottom side and a top side spaced distant from the bottom side in a vertical direction. In the vertical direction, the semiconductor body has a certain thickness. The semiconductor component further has a crack sensor configured to detect a crack in the semiconductor body. The crack sensor extends into the semiconductor body. A distance between the crack sensor and the bottom side is less than the thickness of the semiconductor body. Further, a first value of a characteristic variable of the crack sensor is specified. A second value of the same characteristic variable of the crack sensor is determined at a different time than the first value is specified. If the second value differs from the first value by more than a pre-defined difference, the semiconductor body is determined to have a crack.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 5 is a top view of a semiconductor component of FIG. 1 illustrating a possible run of the crack sensor that has a diode.

FIG. 6A is a vertical cross-sectional view through a section of the semiconductor component having the same top view as the semiconductor component of FIG. 5 with the cross-sections taken in planes E1-E1 and E2-E2.

FIG. 6B is a vertical cross-sectional view through a section of the semiconductor component having the same top view as the semiconductor component of FIG. 5 with the cross-section taken in a plane E3-E3.

FIGS. 28 to 29 schematically illustrate different steps for interrupting an electrically conductive connection line between a contact electrode of a crack sensor and a main electrode of an electronic circuit monolithically integrated in the semiconductor body, wherein the contact electrode, the main electrode and the electrically conductive connection line are parts of a path-connected electrode layer.

FIG. 30A schematically illustrates a first example of a semiconductor component having a crack sensor that is formed as an open ring.

FIG. 36 schematically illustrates a semiconductor component with a crack sensor and an inductor electrically connected to the crack sensor.

FIG. 37 illustrates a method for detecting a crack in a semiconductor body of a semiconductor component having a crack sensor.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
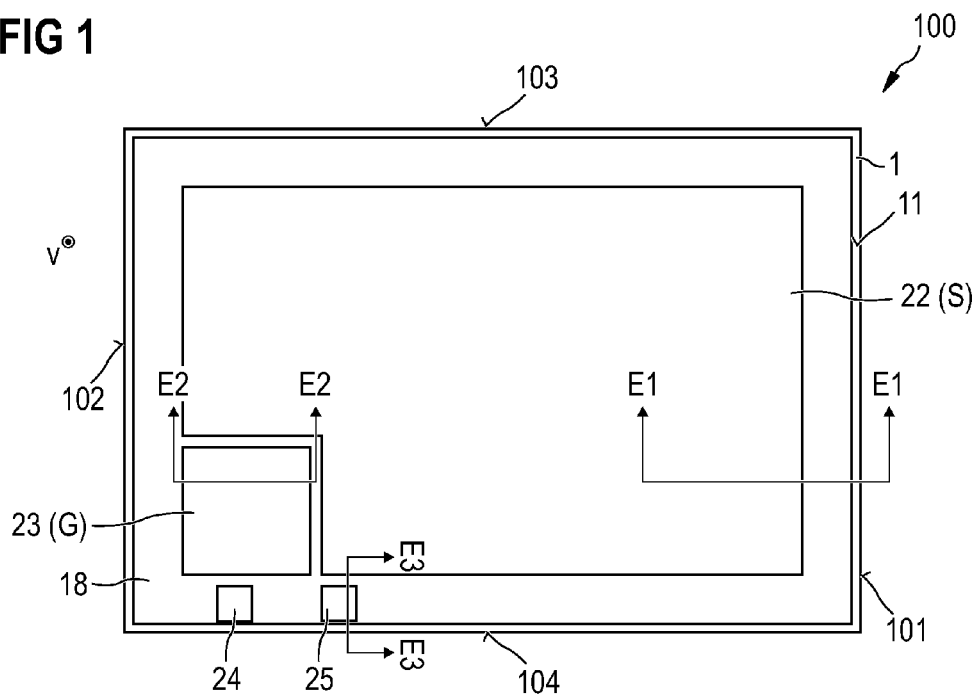
FIG. 1 is a top view of a semiconductor component having a crack sensor.
Figure 2:
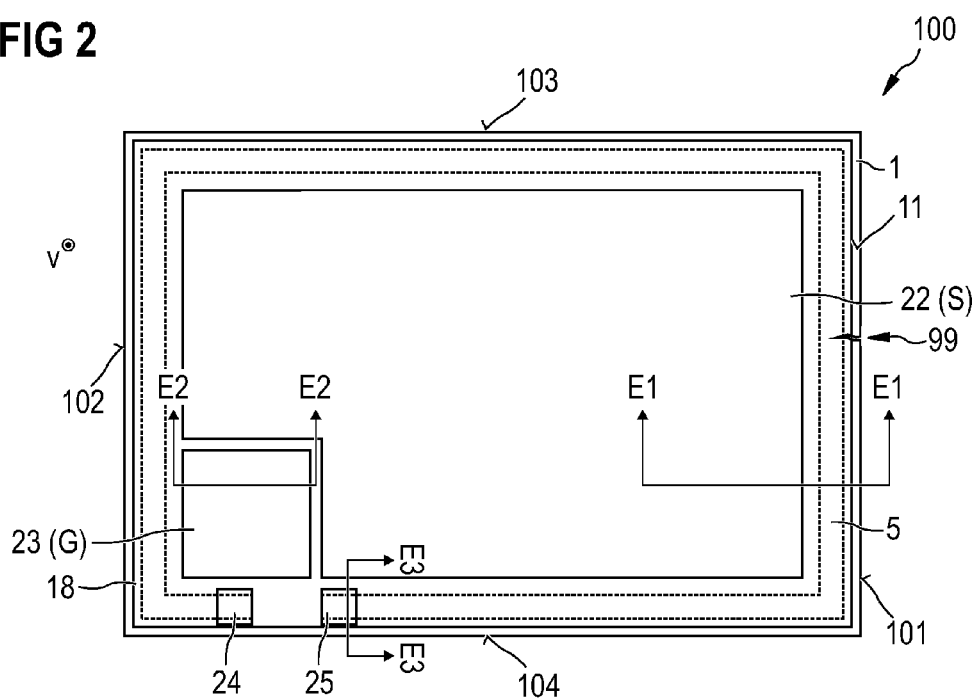
FIG. 2 is a top view of the semiconductor component of FIG. 1 illustrating a possible run of the crack sensor.
Figure 3A:
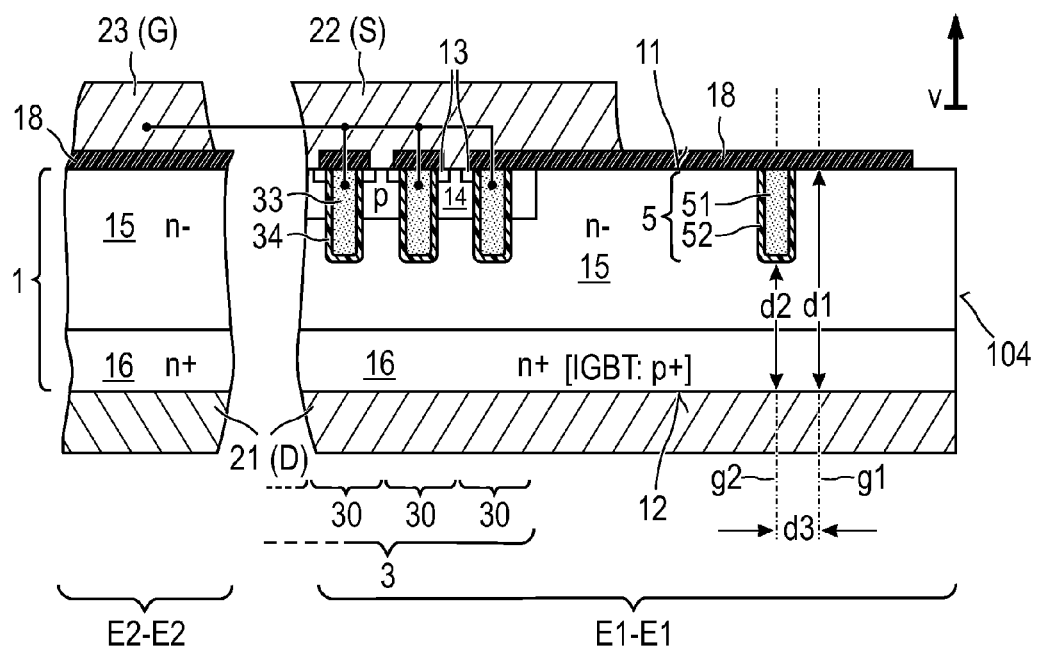
FIG. 3A is a vertical cross-sectional view through a section of the semiconductor component of FIG. 1 in cross-sectional planes E1-E1 and E2-E2.
Figure 3B:
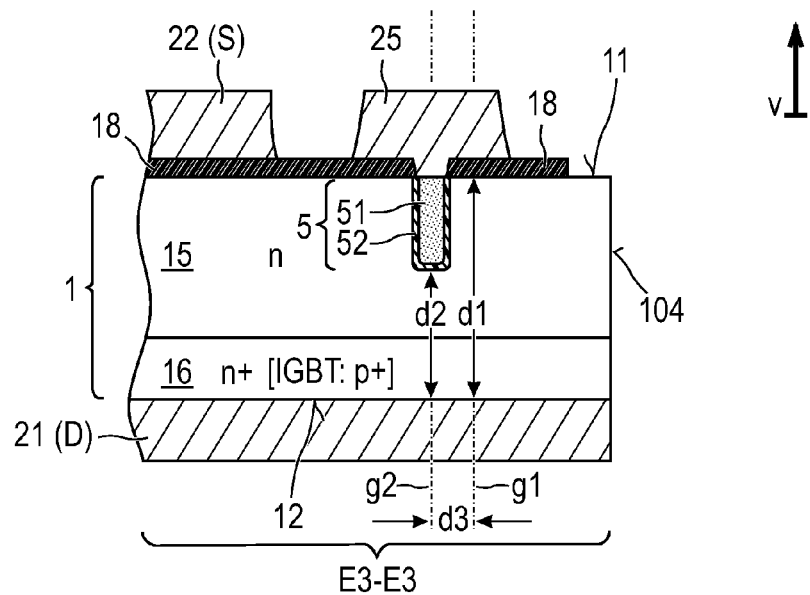
FIG. 3B is a vertical cross-sectional view through a section of the semiconductor component of FIG. 1 in a cross-sectional plane E3-E3.

FIGS. 1 and 2 are top views of the same semiconductor component 100. Cross-sections E1-E1 and E2-E2 are illustrated in FIG. 3A, and a cross-section E3-E3 is illustrated in FIG. 3B. The respective cross-sectional planes run parallel to a vertical direction v of a semiconductor body 1 of the semiconductor component 100. In FIGS. 1 and 2, the vertical direction v runs perpendicular to the drawing plane. In contrast to FIG. 1, FIG. 2 also illustrates the run of a crack sensor 5, however in dashed fashion, as the crack sensor 5 is hidden underneath a dielectric layer 18 arranged on the semiconductor body 1.

The crack sensor 5 and, exemplarily, a power transistor, are monolithically integrated in the semiconductor body 1. However, instead of or in addition to a power transistor, any other electronic structure monolithically integrated in the semiconductor body 1 may be provided. In any case, the crack sensor 5 serves to detect cracks in the semiconductor body 1. Cracks can adversely affect the functionality of the electronic structure, and the detection of a crack in the semiconductor body 1 enables the user or a monitoring or control unit to react in a suitable manner. For instance, the semiconductor component 100 can be permanently disabled or replaced if a crack is detected.

The semiconductor body 1 includes an arbitrary semiconductor material like silicon (Si), silicon carbide (SiC), gallium arsenide (GaAs), gallium phosphide (GaP), or any other IV-IV, III-V or II-VI semiconductor material. In order to realize an electronic structure monolithically integrated in the semiconductor body 1 and having an arbitrary functionality, the semiconductor body 1 may have any combination of doped and/or undoped crystalline semiconductor material, doped and/or undoped polycrystalline semiconductor material, p-conductive semiconductor regions, n-conductive semiconductor regions, trenches, metallization layers, dielectric layers, semiconductor resistance regions, pn-junctions and so on.

For instance, the electronic structure may consist of or have a transistor, e.g. a bipolar or a unipolar transistor like an IGFET (Insulated Gate Field Effect Transistor), a MOSFET (Metal Oxide Semiconductor Field Effect Transistor), an IGBT (Insulated Gate Bipolar Transistor), a JFET (Junction Field Effect Transistor), a thyristor, a diode, a resistor, or any other electronic structure.

The semiconductor body 1 has a bottom side 12 and top side 11 spaced distant from the bottom side 12 in the vertical direction v. As can be seen from FIGS. 3A and 3B, the vertical direction v may run perpendicular to the bottom side 12. The top side 11 and the bottom side 12 form opposite sides of the semiconductor body 1. Further, the semiconductor body 1 has lateral faces 101, 102, 103, 104.

A first main electrode pad 22 and a gate electrode pad 23 are arranged, electrically insulated from one another, on the top side 11. A second main electrode pad 21 is arranged on the bottom side. A load path is formed between the first main electrode pad 22 and the second main electrode pad 21. In case of a transistor or thyristor, an electric current between the first main electrode pad 22 and the second main electrode pad 21, i.e. an electric current through the load path, may be controlled via the gate electrode pad 23. In case of a diode, the gate electrode pad 23 can be omitted. Then, the crack sensor 5 has a first crack sensor electrode pad 24 and a second crack sensor electrode pad 25 arranged on the semiconductor body 1, here both on the top side 11.

The electrode pads 21, 22, 23, 24, 25 serve to electrically connect the semiconductor component 100 to external devices and/or circuits like a circuit board, a power supply, a load, etc. The electrode pads 21, 22, 23, 24, 25 may consist of or include metal, e.g. aluminum, copper, tungsten, titanium, molybdenum, alloys with at least one of those metals, and/or consisting of or include doped polycrystalline semiconductor material like polycrystalline silicon, etc.

Further, for instance in case of a transistor, a thyristor or a diode, the first main electrode pad 22 may be an anode electrode pad and the second main electrode pad 21 may be a cathode electrode pad, or the first main electrode pad 22 may be a cathode electrode pad and the second main electrode pad 21 may be an anode electrode pad, or the first main electrode pad 22 may be a source electrode pad and the second main electrode pad 21 may be a drain electrode pad, or the first main electrode pad 22 may be a drain electrode pad and the second main electrode pad 21 may be a source electrode pad, or the first main electrode pad 22 may be an emitter electrode pad and the second main electrode pad 21 may be a collector electrode pad, or the first main electrode pad 22 may be a collector electrode pad and the second main electrode pad 21 may be an emitter electrode pad.

In the illustrated embodiment, the electronic structure is a vertical power transistor having a plurality of transistor cells 30 arranged in one or more active transistor cell regions 3. For instance, the individual transistor cells 30 may be realized as strip cells running parallel to one another. However, the individual transistor cells 30 may also have any other cell structure like rectangular, square, hexagonal or arbitrarily polygonal.

A drift zone 15 of a first conduction type (here: 'n') and a body zone 14 of a second conduction type (here: 'p') which is complementary to the first conduction type are formed in the semiconductor body 1. The body zone 14, which is arranged between the drift zone 15 and the top side 11, contacts the first electrode pad 22 which here is a source electrode pad 22. Further, a drain zone 16 formed in the semiconductor body 1 is arranged between the bottom side 12 and the drift zone 15 and directly abuts on the drift zone 15. The drain zone 16 is of the first conduction type (here: 'n') if the power transistor is a unipolar IGFET or of the second conduction type (here: 'p') if the power transistor is an IGBT. In both cases, the drain zone 16 has a dopant concentration that is higher than a dopant concentration of the drift zone 15. In the sense of the present invention, 'dopant concentration' relates to the concentration of electrically active dopants, that is, dopants causing either an n-conductivity or a p-conductivity if introduced into the semiconductor body 1.

Further, each of the transistor cells 30 has a one or more heavily doped source zones 13 of a first conduction type (here: 'n'), and a body zone 14 of a second conduction type (here: 'p') complementary to the first conduction type (n);

A doping concentration of the drift zone 15 lies for example in the range of $10^{15}$ cm$^{-3}$ to $10^{17}$ cm$^{-3}$ (1E15 cm$^{-3}$ to 1E17 cm$^{-3}$), a doping concentration of the source zone 13 in the range of $10^{19}$ cm$^{-3}$ to $10^{20}$ cm$^{-3}$ (1E19 cm$^{-3}$ to 1E20 cm$^{-3}$) and a doping concentration of the drain zone 16 in the range of $5*10^{17}$ cm$^{-3}$ to $10^{21}$ cm$^{-3}$ (5E17 cm$^{-3}$ to 1E21 cm$^{-3}$) for a MOSFET and for example in the range of $10^{17}$ cm$^{-3}$ to $10^{19}$ cm$^{-3}$ (1E17 cm$^{-3}$ to 1E19 cm$^{-3}$) for an IGBT.

For controlling an electric current between the first main electrode pad 22 and the second main electrode pad 21, each of the transistor cells 30 has a gate electrode 33, e.g. consisting of or including a doped polycrystalline semiconductor material like polycrystalline silicon, or consisting of or including a metal. A gate dielectric 34, e. g. a semiconductor oxide, is arranged between each of the gate electrodes 33 and the drift zone 15 and the body zone 14 in order to dielectrically insulate the gate electrodes 33 from the drift zone 15 and the body zone 14.

In the vertical direction v, the semiconductor body 1 has a maximum thickness d1. The crack sensor 5 extends into the semiconductor body 1 such that a distance d2 between the crack sensor 5 and the bottom side 12 is less than the thickness d1. Thus, the crack sensor 5 can also detect cracks that occur in the semiconductor body 1 distant from the top side 11. The smaller the distance d2 is, the higher the probability for the crack sensor 5 to detect a crack. For instance, the distance d2 may be less than 80% of the thickness d1 of the semiconductor body 1.

The thickness d1 of the semiconductor body 1 is determined by one or both of the following criteria (a) and (b). According to criterion (a), the thickness d1 of the semiconductor body 1 is the maximum thickness the semiconductor body 1 has in the vertical direction. According to criterion (b), the thickness d1 of the semiconductor body 1 is determined along a first straight line g1 that runs in the vertical direction v, the distance d2 between the crack sensor 5 and the bottom side 12 is determined along a second straight line g2 that runs in the vertical direction v and, accordingly, parallel to the first straight line g1, and the distance d3 between the first straight line g1 and the second straight line g2 is less than 100 μm or less than 20 μm.

As will become clear from FIGS. 3A and 3B, the crack sensor 5 may be partly or completely arranged in a trench that is formed in the semiconductor body 1 and that extends from the top side 11 into the semiconductor body 1. The crack sensor 5 may consist of or comprise a resistance region 51 that is made of an electrically resistive material, for instance a doped polycrystalline semiconductor material, e.g. polycrystalline silicon or any other polycrystalline semiconductor material. In general, such a resistive material may have a specific electrical resistance of less than 0.005 Ohm·cm (0.005 Ω·cm). In order to electrically insulate the resistance region 51 from the semiconductor body 1, the crack sensor 5 comprises a dielectric 52 arranged between the semiconductor body 1 and the resistance region 51.

So as to allow for electrically tapping the crack sensor 5, a protrusion of the second crack sensor electrode pad 25 extends through the dielectric layer 18 and electrically contacts the resistance region 51. In the same manner, a protrusion of the first crack sensor electrode pad 24 extends through the dielectric layer 18 and electrically contacts the resistance region 51 distant from the contact face between the protrusion of the second crack sensor electrode pad 25 and the resistance region 51. Thus, using the first and second crack sensor electrode pads 24, 25, an electrical resistance of the resistance region 51 may be determined. In case of a crack 99 that affects the resistance sensor 5 (see FIG. 2), the electrical resistance of the resistance region 51 will increase. Thus, evaluating the electrical resistance or a change of the electrical resistance allows for detecting the occurrence of a crack 99.

Figure 4A:
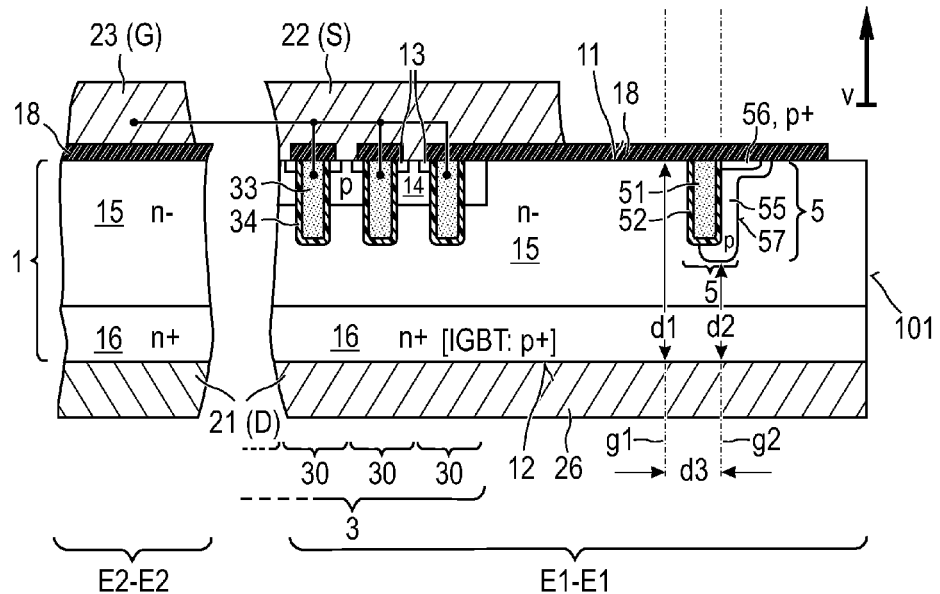
FIG. 4A is a vertical cross-sectional view through a section of the semiconductor component having the same top view as the semiconductor component of FIG. 1 with the cross-sections taken in planes E1-E1 and E2-E2.
Figure 4B:
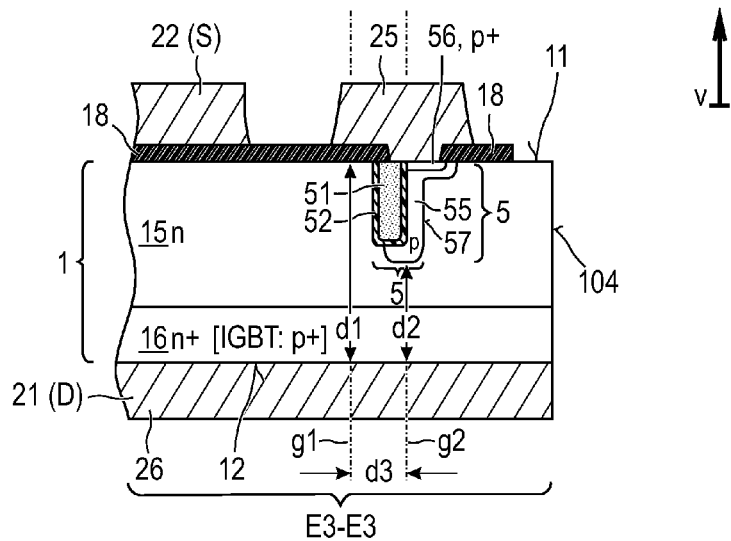
FIG. 4B is a vertical cross-sectional view through a section of the semiconductor component having the same top view as the semiconductor component of FIG. 1 with the cross-section taken in a plane E3-E3.

FIGS. 4A and 4B show cross-sections of a semiconductor component 100 that has the same top view as the semiconductor component 100 of FIGS. 1 and 2. The cross-sections E1-E1 and E2-E2 are illustrated in FIG. 4A, and the cross-section E3-E3 is illustrated in FIG. 4B. The design of the semiconductor component 100 of FIGS. 4A and 4B is substantially identical to the design of the semiconductor component 100 described with reference to FIGS. 3A and 3B. The sole differences are as follows:

1. The crack sensor 5 additionally has a pn-junction 57 formed between a p-conductive semiconductor region 55 and complementary conductive semiconductor region (here: the drift zone 15).
2. An optional, highly p-conductive semiconductor region 56 ("contact region") which is a part of the p-conductive semiconductor region 55 electrically and mechanically contacts the second crack sensor electrode pad 25, the latter being illustrated in FIG. 4B.
3. The pn-junction 57 is a part of a diode that is electrically connected between the second crack sensor electrode pad 25 and the second main electrode pad 21, the latter of which is also a third crack sensor electrode pad 26.

As exemplarily illustrated in FIGS. 4A and 4B, the crack sensor 5 may include both a resistance region 51 with a dielectric 52, and a pn-junction 57 of a diode. In case of a crack 99 that affects the resistance sensor 5 (see FIG. 2), a leakage current of the pn-junction will increase. Thus, evaluating the leakage current of the pn-junction, i.e. the leakage current of the diode pn-junction 57 described above, or evaluating a change of the leakage current of that pn-junction 57, allows for detecting the occurrence of a crack 99. The second crack sensor electrode pad 25 and the second main electrode pad 21 may be used to electrically connect the diode to a monitoring or control unit that measures the leakage current. The electrical resistance of the resistance region 51 may be evaluated in the same manner as described with reference to FIGS. 3A and 3B.

As further exemplarily illustrated in FIGS. 5, 6A and 6B, a crack sensor 5 may also include a pn-junction 57 of a diode but no resistance region 51 and no dielectric 52. FIG. 5 is a top view of the semiconductor component 100, FIG. 6A illustrates cross-sections E1-E1 and E2-E2, and FIG. 6B a cross-section E3-E3 of the semiconductor component 100 of FIG. 5. The p-conductive semiconductor region 55 and its subregion 56 may be produced in the semiconductor body 1 using conventional techniques. The leakage current of the diode's pn-junction 57 may be evaluated in the same manner as described with reference to FIGS. 4A and 4B. In such an embodiment, the first crack sensor electrode pad 24 is dispensable, as can be seen from FIG. 5 in comparison with FIGS. 1 and 2.

As can also be seen from FIG. 5, any crack sensor 5 (here: the pn-junction 57) may optionally have the shape of a closed ring that surrounds an arbitrary electronic structure (here: a transistor) monolithically integrated in the semiconductor body 1 as described above.

Referring now to FIGS. 7 to 16 there will be explained a possibility for producing a semiconductor component 100 having a crack sensor 5 with both a unit having a resistance region 51 and a dielectric 52, and a diode with a pn-junction 57 as explained with reference to FIGS. 4A and 4B.

Figure 7:
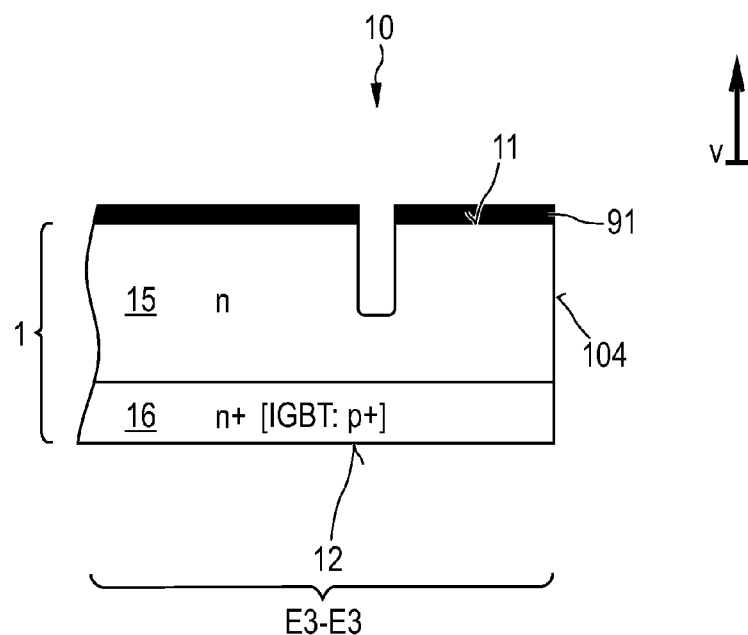
FIGS. 7 to 16 illustrate a method for producing the semiconductor component illustrated in FIGS. 4A and 4B.

After providing a semiconductor body 1 which or a part of which will form the semiconductor body 1 as described above, a first mask layer 91 is deposited on the top side 11 and subsequently structured (e.g. photo-lithographically) so as to have an opening. The opening is used in an etching step to produce a trench 10 that extends from the top side 11 into the semiconductor body 1. In principle, any etching technique may be used. However, as the semiconductor material of the semiconductor body 1 is expensive, costs may be reduced if the trench 10 is narrow. As (in particular for deep trenches) an isotropic etching technique like wet etching causes a significant under-etch of first mask layer 91, an anisotropic etching technique (e.g. RIE=reactive ion etching) may be used if a narrow trench 10 is desired. FIG. 7 shows the arrangement afterword with a completed anisotropically etched trench 10.

Figure 8:
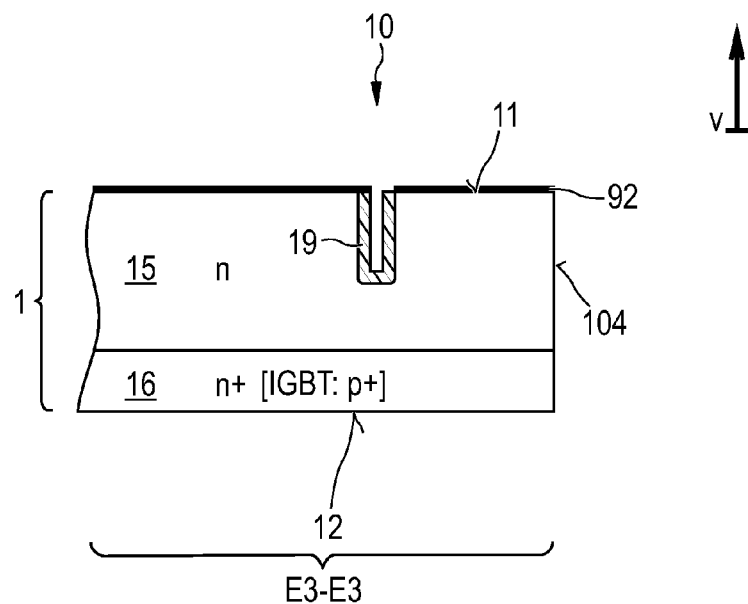

Then, an implant blocking layer 19, for instance an oxide layer, is conformally produced in the trench 10 on the surface of the semiconductor body 1, e.g. by oxidizing the semiconductor material of the semiconductor body 1, or by depositing the implant blocking layer 19 on the surface of the trench. On the top side 11, a second mask layer 92 having an opening is produced such that the second mask layer 92 partially covers the implant blocking layer 19. The resulting structure is illustrated in FIG. 8.

Figure 9:
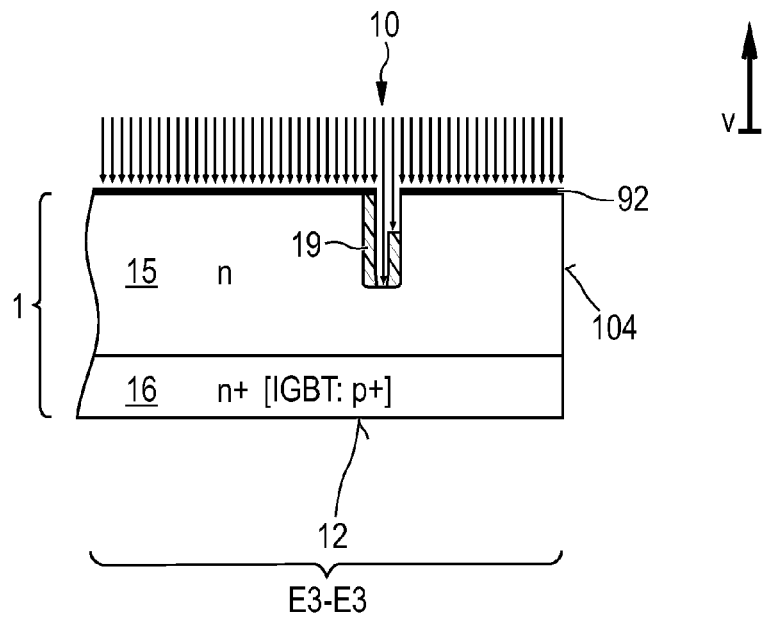
Figure 10:
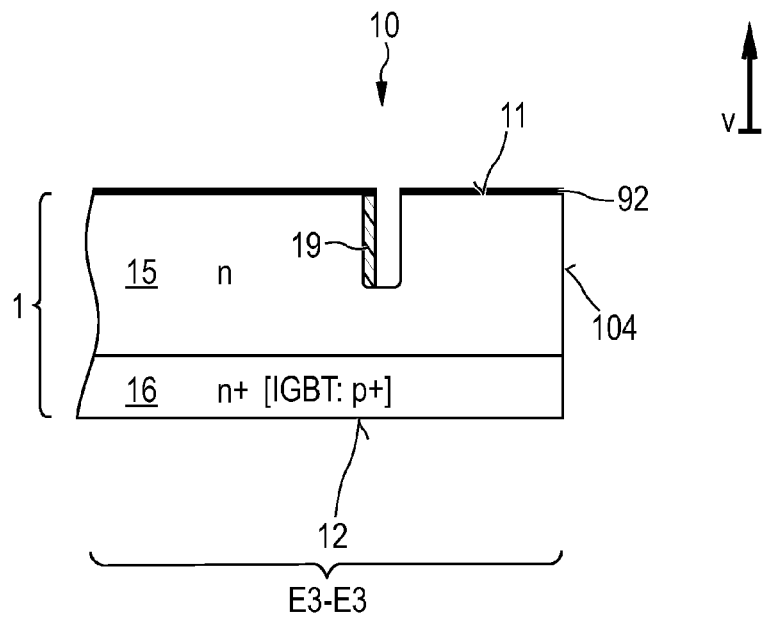

Next, the implant blocking layer 19 is partially removed underneath the openings of the second mask layer 92 using an anisotropic etching technique, e.g. RIE. FIG. 9 illustrates the arrangement during the anisotropic etching which is schematically illustrated by parallel arrows. FIG. 10 shows the arrangement, after the anisotropic etching is completed, with a remainder of the implant blocking layer 19 covering one (here: the inner side wall 105) of the side walls 105, 106 underneath there where the second mask layer 92 laterally protrudes the trench 10.

Figure 11:
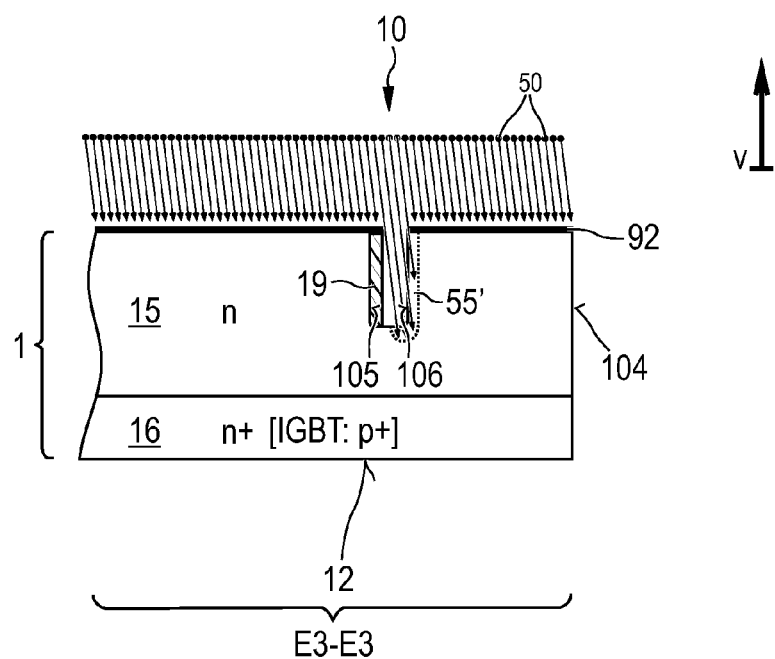

As further illustrated in FIG. 11, the remaining part of the implant blocking layer 19 is then used during an angled implantation of electrically active dopants 50 into the semiconductor body 1. In this regard, "angled" means that the direction of the implantation (indicated by parallel arrows) and the vertical direction v enclose a first (implantation) angle that is different from both 0° and 180°. Due to the angled implantation, the dopants 50 are implanted in particular through an outer side wall 106 of the trench 10, where the trench 10 is not covered by the remaining part of the implant blocking layer 19, into a target area 55' of the semiconductor body 1.

In order to implant dopants 50 in the same way at the opposite side of the semiconductor component 100 into the semiconductor body 1 (see FIG. 12), i.e. on that side of the semiconductor component 100 which in FIGS. 1 and 2 is close to the lateral face 102, a further angled dopant implantation is carried out under a second implantation angle that is different from the first implantation. The remaining part of the implant blocking layer 19 blocks the dopants 50 from being implanted through the inner side wall 105 into the semiconductor body 1. As a result, the pn-junction 57 is formed in the semiconductor body 1 between the trench 10 and that side of the trench 10 arranged closer to the lateral surface of the semiconductor body 10, wherein the lateral surface is formed by the side faces 101, 102, 103 and 104. Hence, a developing crack that usually emanates from the lateral surface of the semiconductor body 10 can be detected as soon as it affects the pn-junction 57 and, respectively, a leakage current through the pn-junction. In other embodiments however, the pn-junction 57 may be produced without using an implant blocking layer 19 such that the electrically active dopants 50 are implanted through the whole surface of the trench 10. That is, the surface of the trench 10 is completely formed by the target area 55' and, in the completed semiconductor component, by the p-conductive semiconductor region 55.

In the same way, two further implantation steps with individual implantation angles may be carried out for implanting dopants 50 also through the outer side walls 106 of the trench 10 where the trench 10 runs parallel to the lateral faces 103 and 104, respectively.

Figure 12:
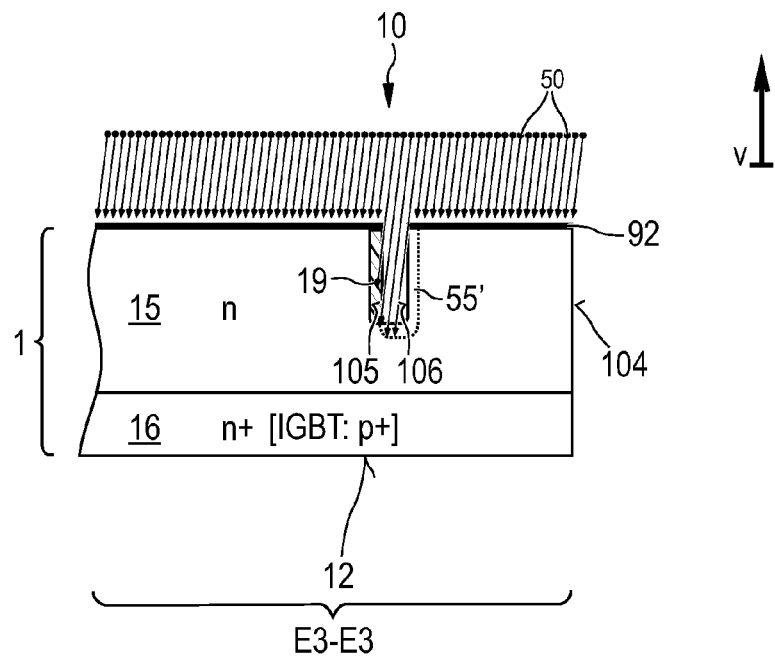

Implanting, for each section of the crack sensor 5 that runs parallel to one of the lateral faces 101, 102, 103, 104, dopants 50 through an outer side wall 106 and/or an inner side wall 105 and/or the bottom side of a respective section of a ring-shaped trench 10 leads to a ring-shaped implantation region (the target area 55'), the boundary of which is schematically illustrated in FIGS. 11 and 12 by dotted lines.

The type and the concentration of the implanted dopants 50 are chosen such that in the target area 55' the type of the conductivity is inverted. In the present example, the target area 55' is n-conducting prior to the implantation and p-conducting after the implantation. However, in other embodiments it is also possible that the dopants change the type of conductivity in the target area 55' from 'p' to 'n'.

Figure 13:
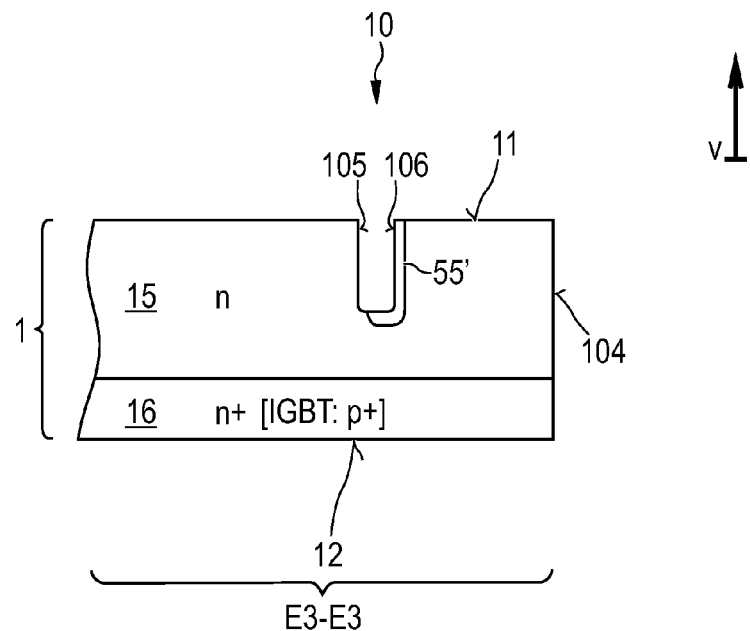

In any case, an annealing step optionally may be carried out after the implantation is completed. FIG. 13 illustrates the arrangement after an annealing step and removal of the second mask layer 92. Due to the annealing step, the distribution of the implanted dopants 50 changes and forms the p-conductive semiconductor region 55 already explained with reference to FIGS. 3A and 3B. In other embodiments where the dopants act n-doping, the semiconductor region 55 would be n-conductive. Generally, due to the implantation of the dopants 50, n pn-junction 57 is created.

Figure 14:
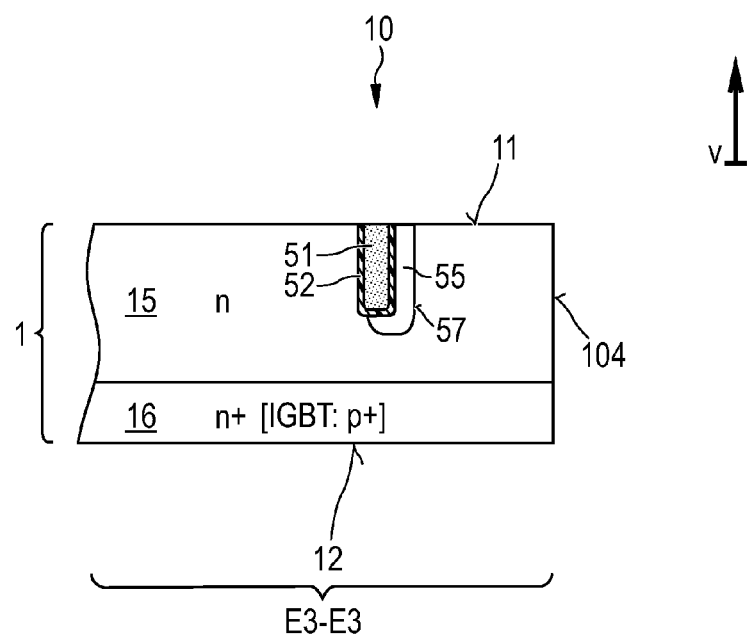
Figure 15:
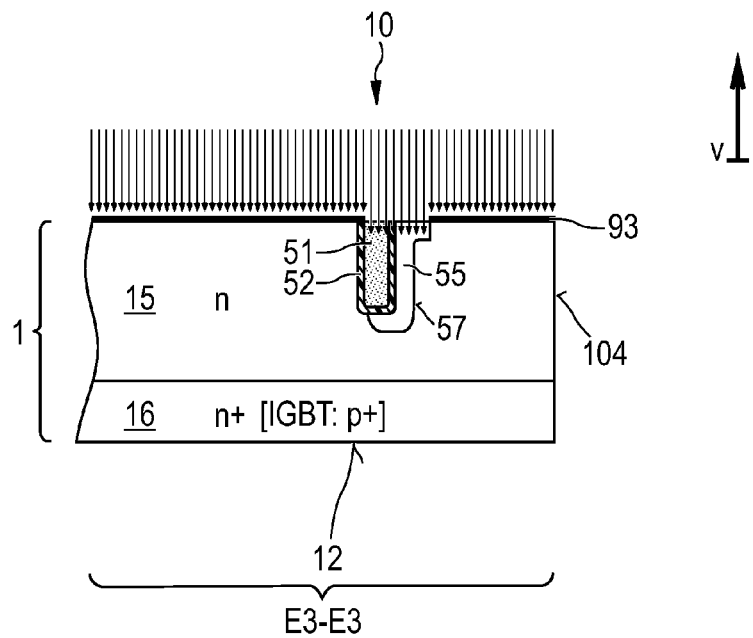
Figure 16:
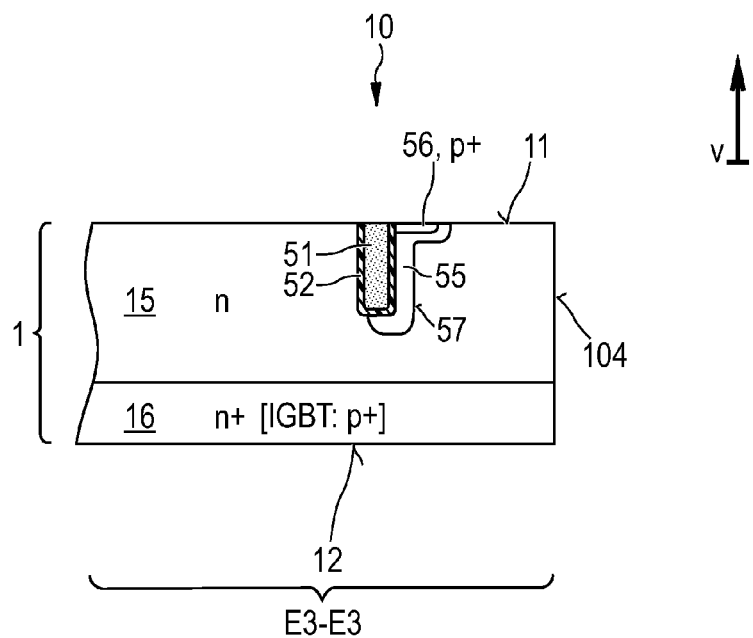

In subsequent conventional steps, the result of which is illustrated in FIG. 14, a dielectric 52 is formed in the trench 10 and then the remaining open region of the trench 10 is filled with a resistive material 51.

In order to produce a low-resistive electrical contact between the p-conductive region 55 and the protrusion of the second crack sensor electrode pad 25 (see FIG. 4B), the optional highly p-conductive semiconductor contact region 56 may be formed, for instance by introducing p-type dopants into the semiconductor body 1 adjacent to the top side 11, e.g. in an implantation or diffusion step. In case of an n-conductive region 50 however, the contact region 56 would also be n-conductive, and the dopants for producing the contact region would be n-type instead of p-type.

The further process steps of forming the structured dielectric 18, the second crack sensor electrode pad 25, the first main electrode pad 22 and the second main electrode pad 21 may be carried out in any conventional manner known to those skilled in the art.

In the previous embodiments, crack sensors 5 with a first crack sensor electrode pad 24 and/or a second crack sensor electrode pad 25 and/or a third crack sensor electrode pad 26 have been explained. In principle, electrically contacting a crack sensor 5 may be carried out in arbitrary manner. Some examples are explained next with reference to FIGS. 17 to 23.

Figure 17:
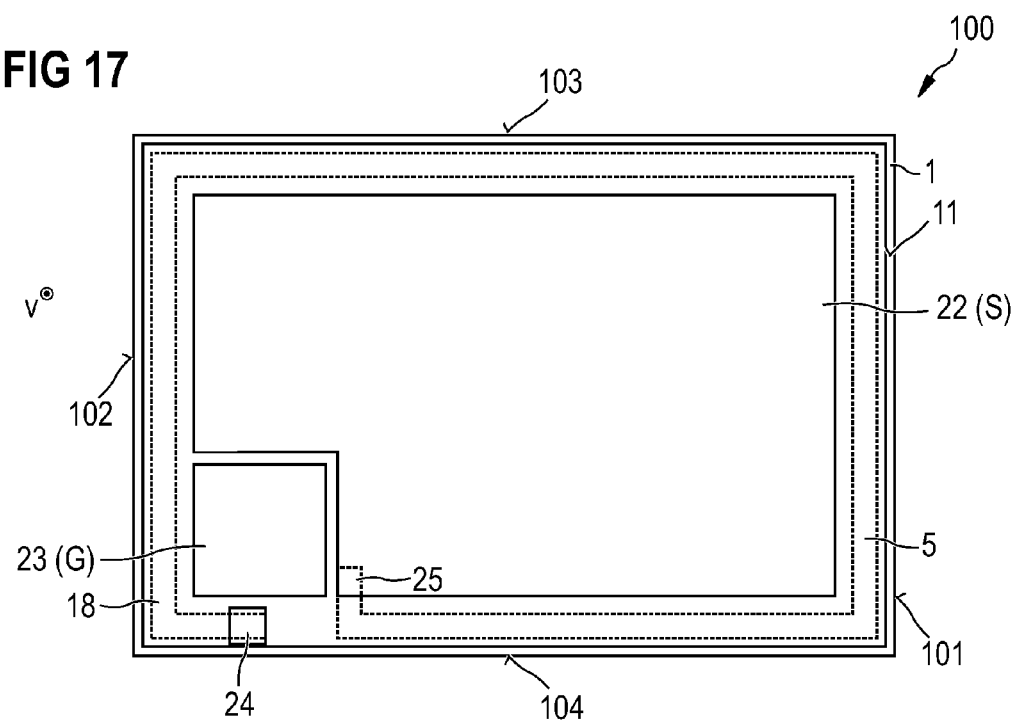
FIG. 17 is a top view of a semiconductor component having a crack sensor that is electrically connected to a main electrode of an electronic structure monolithically integrated in the semiconductor body.

In FIG. 17, which is a top view of a semiconductor component 100, the first main electrode pad 22 of an electronic structure monolithically integrated in the semiconductor body 1 serves also as an electrode pad (here: electrode pad 25) for electrically contacting the crack sensor 5. To this, the first main electrode pad 22 may have a protrusion that extends through the dielectric layer 18 and electrically contacts the crack sensor 5 in the same manner as the protrusion of the second crack sensor electrode pad 25 described above with reference to FIG. 3B or 4B.

Figure 18:
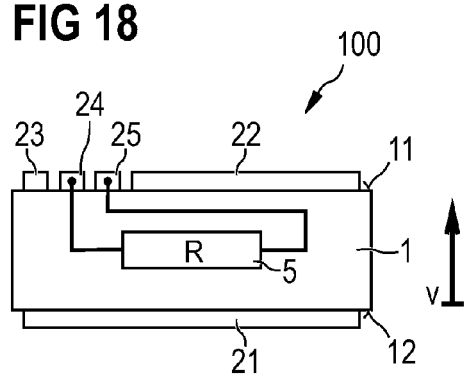
FIGS. 18 to 20 schematically illustrate different possibilities for electrically connecting a crack sensor that has a resistance sensor.
Figure 19:
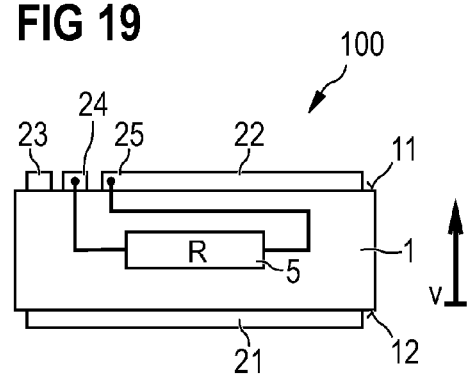
Figure 20:
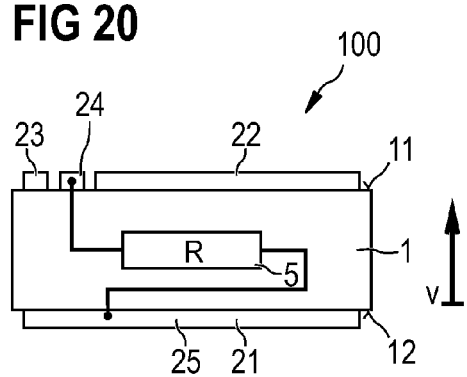

In the schematic side views of FIGS. 18, 19 and 20, the crack sensor 5 has a resistance sensor R.

In FIG. 18, the resistance sensor R is electrically connected between two individual contact electrode pads 24 and 25 arranged on the top side 11.

In FIG. 19, the resistance sensor R is electrically connected between a contact electrode pad 24 and a contact electrode pad 25 that is identical to a first main electrode contact pad 22 of an electronic structure monolithically implemented in the semiconductor body 1, both arranged on the top side 11. This principle is also illustrated in FIG. 17.

In FIG. 20, the resistance sensor R is electrically connected between a contact electrode pad 24 arranged on the top side 11 and a contact electrode pad 25 arranged on the bottom side 12, wherein the contact electrode pad 25 is identical to a second main electrode pad 21 of an electronic structure monolithically implemented in the semiconductor body 1.

Figure 21:
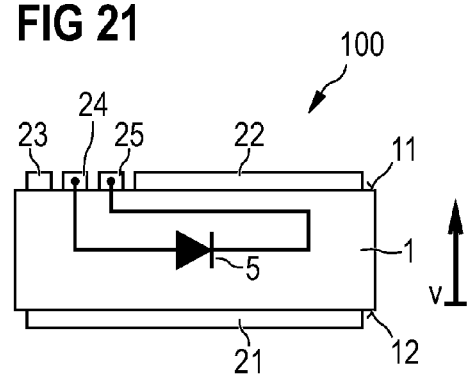
FIGS. 21 to 23 schematically illustrate different possibilities for electrically connecting a crack sensor that has pn-junction.
Figure 22:
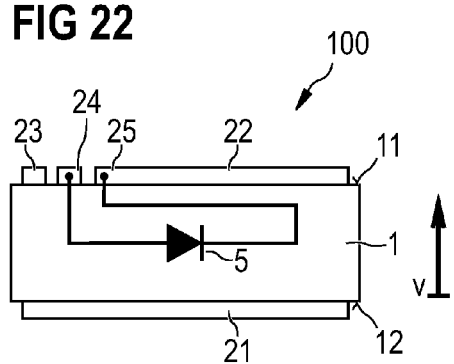
Figure 23:
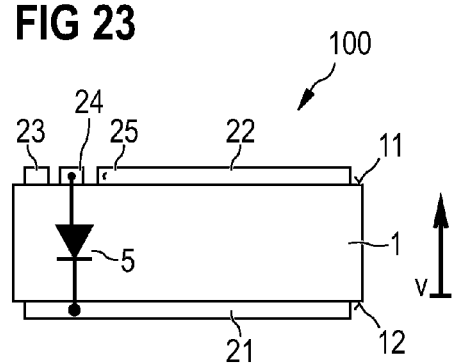

Further, in the schematic side views of FIGS. 21, 22 and 23, the crack sensor 5 has a diode.

In FIG. 21, the diode is electrically connected between two individual contact electrode pads 24 and 25 arranged on the top side 11.

In FIG. 22, the diode is electrically connected between a contact electrode pad 24 and a contact electrode pad 25 that is identical to a first main electrode contact pad 22 of an electronic structure monolithically implemented in the semiconductor body 1, both arranged on the top side 11. This principle is also illustrated in FIG. 17.

In FIG. 23, the diode is electrically connected between a contact electrode pad 24 arranged on the top side 11 and a contact electrode pad 25 arranged on the bottom side 12, wherein the contact electrode pad 25 is identical to a second main electrode pad 21 of an electronic structure monolithically implemented in the semiconductor body 1.

Alternative to the embodiments illustrated in FIGS. 21, 22 and 23, the diode may have a polarity opposite to the depicted polarity.

The embodiments explained in FIGS. 18 to 23 may be combined in an arbitrary manner. In particular, a crack sensor 5 may have a resistance sensor R electrically connected as explained with reference to FIGS. 18 to 20, and any diode electrically connected as explained with reference to FIGS. 21 to 23.

Figure 24:
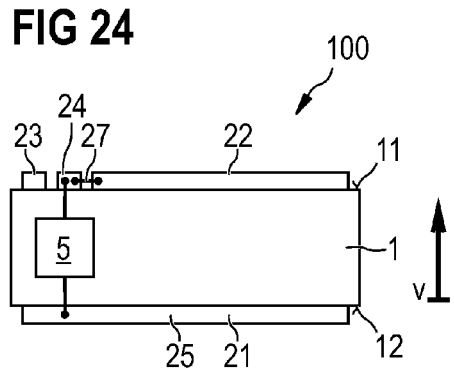
FIGS. 24 to 25 schematically illustrate different steps for interrupting an electrical connection between a contact electrode of a crack sensor and a main electrode of an electronic structure monolithically integrated in the semiconductor body.
Figure 25:
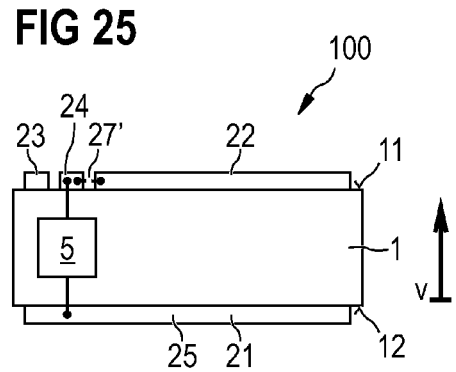

As schematically illustrated in FIGS. 24 and 25, a crack sensor electrode pad (here: the crack sensor electrode pad 24) that is electrically connected to a main electrode pad (here: the first main electrode pad 22) may be separated from the main electrode pad by interrupting an electrical connection line 27. In FIG. 24, the crack sensor electrode pad 24 and the main electrode pad 22 are electrically connected by a connection line 27 which is interrupted, for instance by fusing. The arrangement with the interrupted connection line 27' is shown in FIG. 25.

Figure 26:
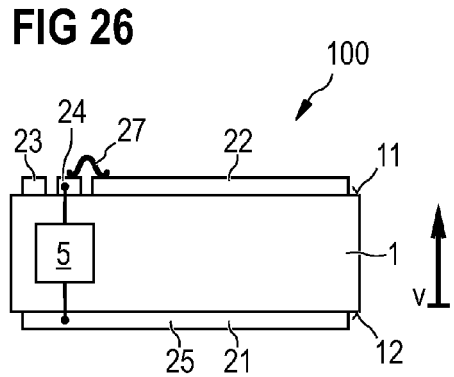
FIGS. 26 to 27 schematically illustrate different steps for interrupting an electrical bonding wire connection between a contact electrode of a crack sensor and a main electrode of an electronic circuit monolithically integrated in the semiconductor body.
Figure 27:
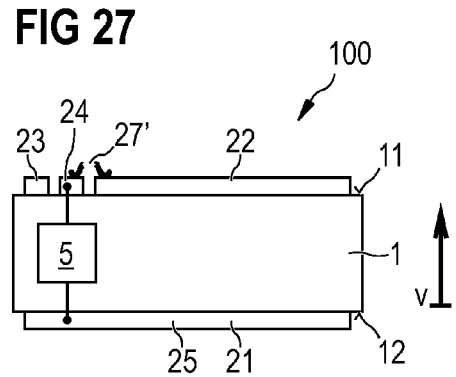

According to a first embodiment illustrated in FIGS. 26 and 27, the connection line 27 may be a thin bonding wire that directly contacts both the crack sensor electrode pad 24 and the main electrode pad 22. The arrangement with the interrupted bonding wire 27' is shown in FIG. 27. For instance, the thin bonding wire may have a cross-sectional area of less than or equal to 100 μm, or of less than or equal to 30 μm.

A second embodiment is illustrated in FIGS. 28 and 29. As shown in the top view of FIG. 28, the main electrode pad 22, the crack sensor electrode pad 24 and the connection line 27 are part of a path-connected electrode layer. The arrangement with the interrupted connection line 27' is shown in FIG. 29.

As already explained with reference to the above embodiments, a crack sensor 5 may have the shape of an open or closed ring that surrounds an electronic structure monolithically integrated in the semiconductor body 1. FIG. 30A illustrates a crack sensor 5 that is embodied as an open ring. As can be seen from FIG. 30A, the crack sensor 5 surrounds, in a cross-sectional plane perpendicular to the vertical direction v, a point P located in the cross-sectional plane and in the open ring over an angle α. For instance, the angle α may be at least 330°.

Alternatively or in addition, the crack sensor 5 that is formed as an open ring may have a gap 53 with a width w53 of less than or equal to 200 μm, or of less than or equal to 100 μm.

Figure 30B:
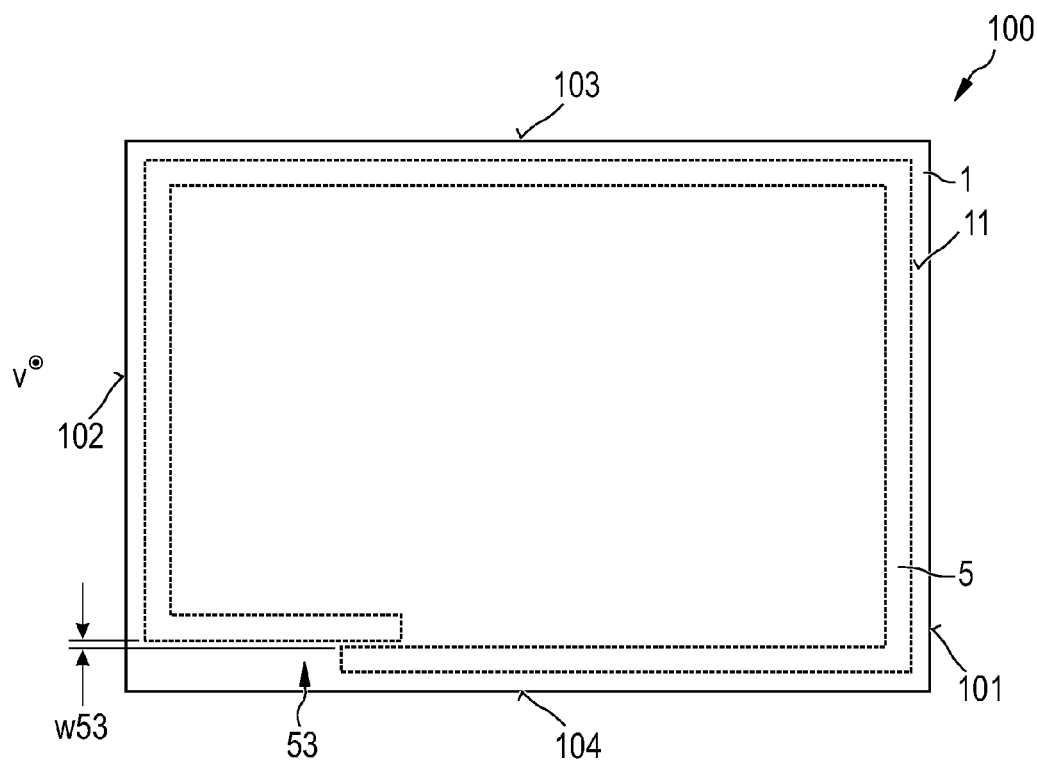
FIG. 30B schematically illustrates a second example of a semiconductor component having a crack sensor that is formed as an open ring.

FIG. 30B illustrates yet another embodiment of the crack sensor 5 formed as an open ring having a gap 53 with a width w53.

Figure 31:
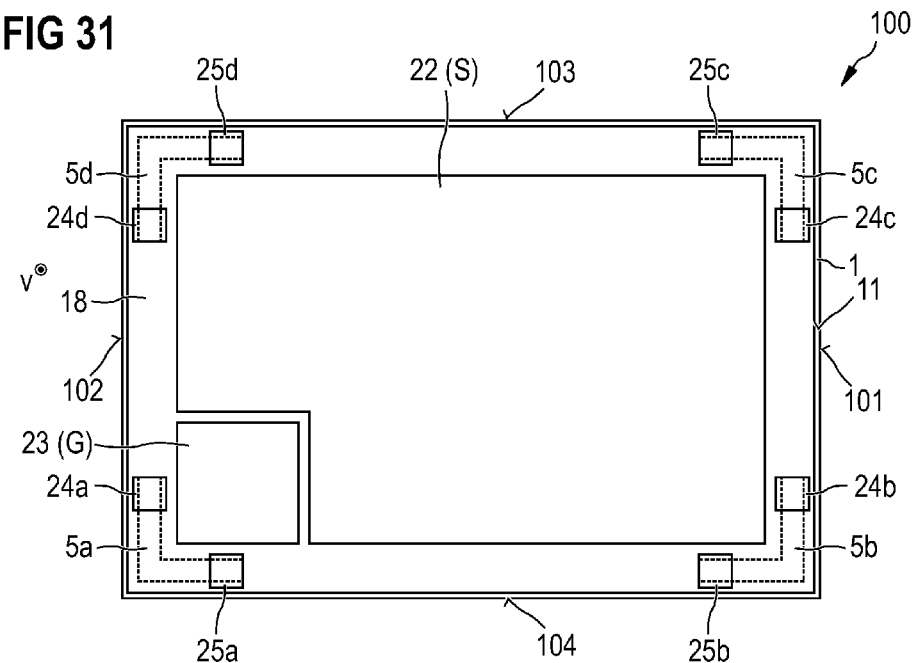
FIG. 31 schematically illustrates a semiconductor component having corners with a crack sensor arranged in each corner.

According to an embodiment illustrated in FIG. 31, a semiconductor component 100 may have more than one crack sensor 5a, 5b, 5c, 5d. Here, each of the crack sensors 5a, 5b, 5c, 5d is arranged in one of the corners of the semiconductor body 1.

Figure 32:
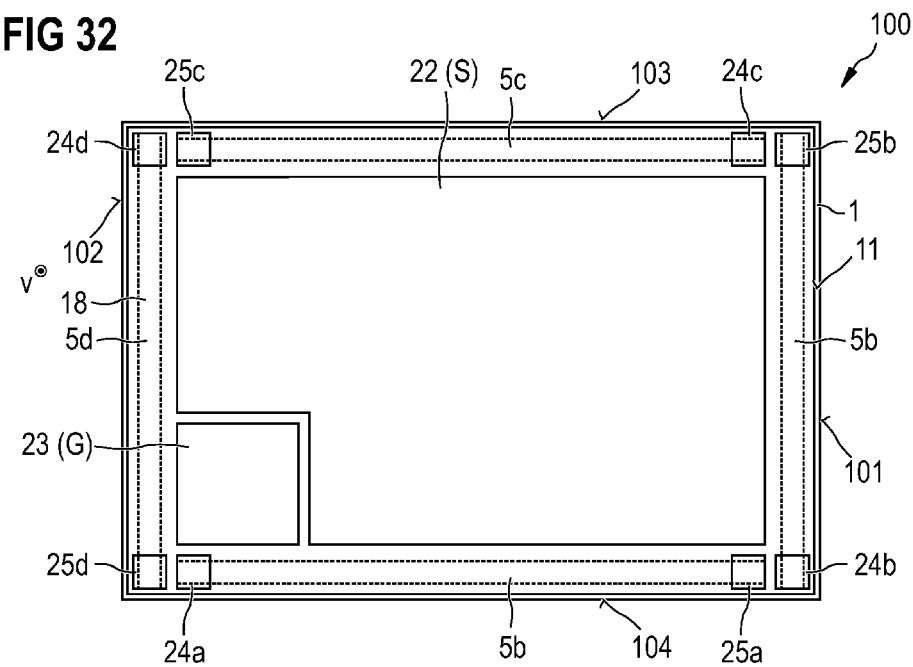
FIG. 32 schematically illustrates a semiconductor component having a number of crack sensors.

According to a further embodiment illustrated in FIG. 32, one or more of the crack sensors 5a, 5b, 5c, 5d may be arranged along another one of the lateral faces 101, 102, 103, 104 of the semiconductor body 1.

In both embodiments of FIGS. 31 and 32, each of the crack sensors 5a, 5b, 5c, 5d has an individual pair of crack sensor electrode pads 24a/25a, 24b/25b, 24c/25c and 24d/25d, respectively. Each of the crack sensors 5a, 5b, 5c, 5d may be independent from the wiring of the other ones of the crack sensors 5a, 5b, 5c, 5d, electrically connected such that one of the respective crack sensor electrode pads 24a/25a, 24b/25b, 24c/25c and 24d/25d is identical to main electrode pad 21 or 22 of an electronic structure monolithically arranged in the semiconductor body 1 in the same manner as explained above with reference to FIGS. 3A, 3B, 4A, 4B, 5, 6A, 6B, 17, 19, 20 and 22 to 28.

According to a further embodiment, two or more independent crack sensors may be electrically connected to one another via crack sensor electrode pads. For instance, if in FIG. 31 each of the crack sensors 5a, 5b, 5c, 5d has a resistance sensor that may be individually evaluated via the crack sensor electrode pads 24a/25a, 24b/25b, 24c/25c and 24d/25d, respectively, then those resistance sensors may be electrically connected in series, for instance by electrically connecting the crack sensor electrode pads 25a with 25b, 24b with 24c, 25c with 25d and 24d with 24a. Then, the crack sensor electrode pads 24a and 25a may be used to commonly evaluate the series resistance of the resistance sensors.

Figure 33A:
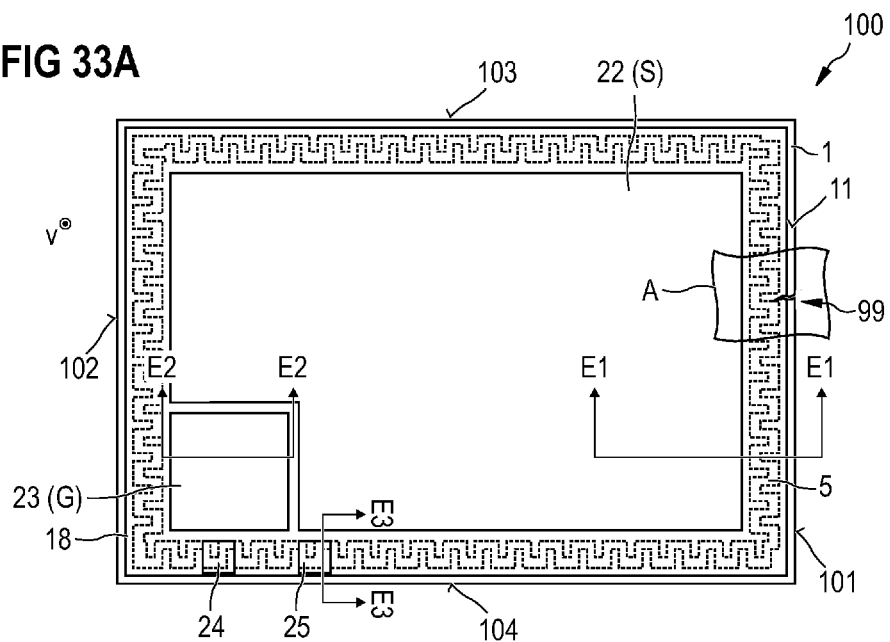
FIGS. 33A to 33C schematically illustrate a semiconductor component with a crack sensor having a meander-like structure.
Figure 33B:
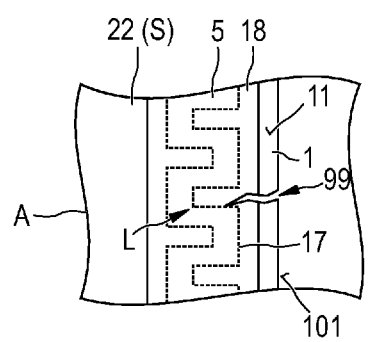
Figure 33C:
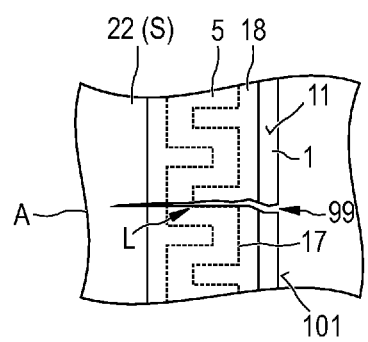

FIG. 33A is a top view of a semiconductor component 100 having a crack sensor 5 with a meander-like structure. FIG. 33B shows an enlarged view of a section 'A' of FIG. 33A with a crack 99 emanating from the lateral face 101 of the semiconductor body 1. When the crack 99 occurs and propagates into the semiconductor body 1, it will be intercepted by the meander-like crack sensor 5 and guided along the surface 17 of the crack sensor 5 and the semiconductor body 1 in the direction of the interface. However, if the surface 17 of the crack sensor 5 significantly changes its orientation as it is the case at a location L illustrated in FIGS. 33B and 33C, the crack 99 will cut through the crack sensor 5, thereby affecting the value of a characteristic variable of the crack sensors 5, e.g. the resistance. The same effect may be achieved by other similar crack sensor structures 5.

Figure 34A:
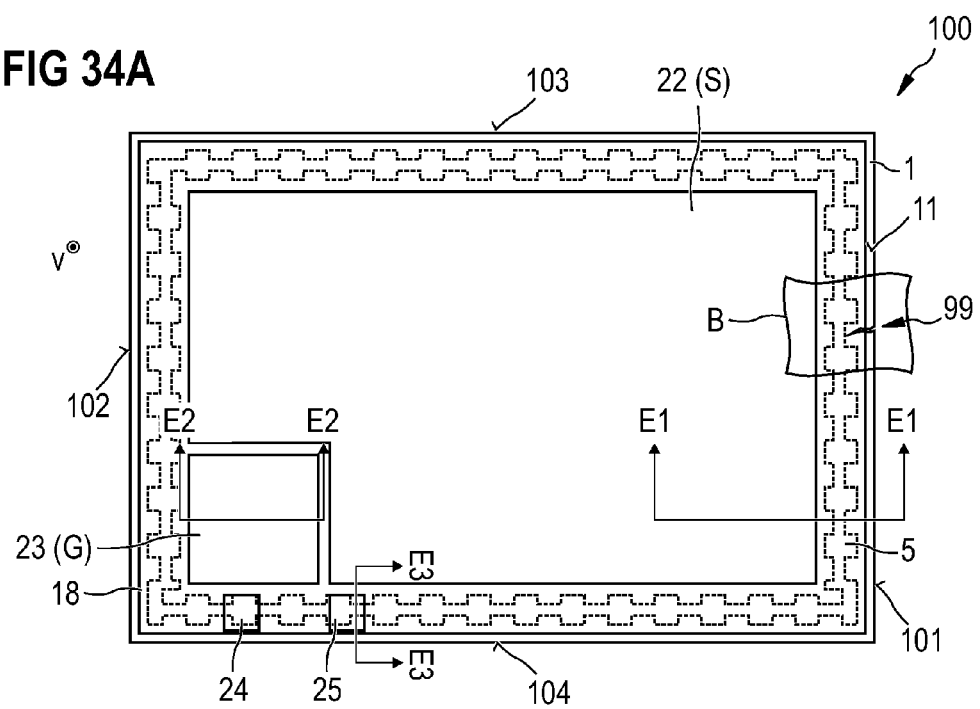
FIGS. 34A to 34C schematically illustrate a semiconductor component with a crack sensor having a repetitively constricted structure.
Figure 34B:
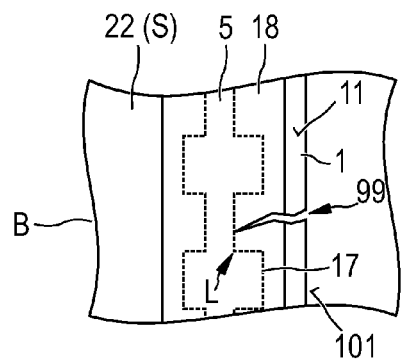
Figure 34C:
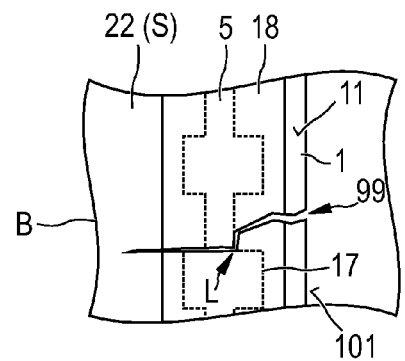

A further embodiment is illustrated in FIGS. 34A to 34C with a crack sensor 5 having a repetitively constricted structure. FIGS. 34B and 34C show an enlarged section 'B' of FIG. 34A. The principle explained with reference to FIGS. 33A to 33C and 34A to 34C, in particular applies to crack sensors 5 with a dielectric 52 (see FIGS. 3A, 3B, 4A and 4B) that directly abuts the surface 17 of the crack sensor 5.

As will become clear from the embodiments described above, one or more than one crack sensor 5 may be located at different places in the semiconductor body 1 in order to detect and/or monitor the occurrence of a crack 99 in the semiconductor body 1 or at critical areas of the semiconductor body 1. For redundancy reasons, it is also possible to use two or more crack sensors 5 for observing the same critical area. Then, a crack sensor 5 may have a spiral form shape, or multiple, overlapping sections. Further, one or more crack sensors 5 may be located between the outer circumference of the semiconductor body 1 (in FIGS. 1, 2, 5, 17, 30, 31, 32, 33A and 34A given by the lateral faces 101, 102, 103, 104) and an electronic circuit (in the described embodiments the transistor 3) monolithically integrated in the semiconductor body 1.

Referring now to FIGS. 35A to 35D, there will be explained different methods for detecting a crack 99 in a semiconductor body 1.

Figure 35A:
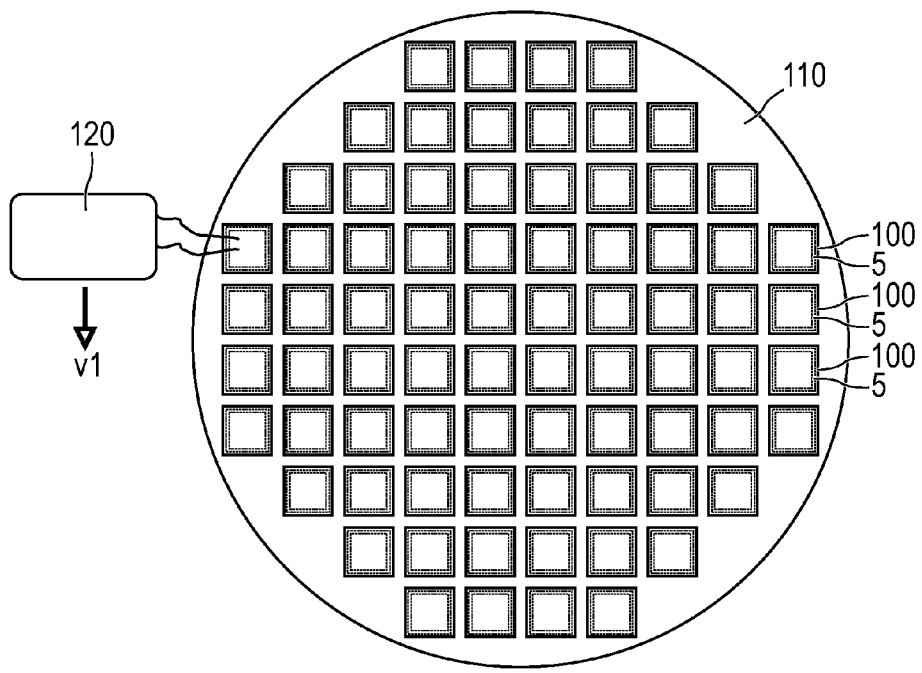
FIG. 35A schematically illustrates determining a value of a characteristic variable of a crack sensor of a semiconductor component that is in a wafer composite.

FIG. 35A shows a semiconductor wafer 110 with several semiconductor components 100. The semiconductor components 100 are parts of a common wafer disk. Each of the semiconductor components 100 has a crack sensor 5 that may have one of the designs described above. An evaluation unit 120 may be used to measure a value v1 of a characteristic variable, e.g. the resistance and/or leakage current of the crack sensor 5 of one, more than one or all semiconductor components 100 of the wafer 110.

As each of the measured values v1 is individually assigned to the respective semiconductor component 100, each of the semiconductor components 100 may be marked with the respective value v1, be it un-coded (e.g. imprinted numeric value plus unit) and/or coded (e.g. imprinted bar code, stored in a memory that is fixedly mounted on the respective semiconductor component 100 or monolithically integrated in the semiconductor body 1 of the respective semiconductor component 100). In this context, "marked" is intended to include any method that allows for reading out the respective value v1 from the semiconductor components 100 themselves.

Alternatively or in addition, each of the semiconductor components 100 may be marked (in the sense as defined above) with an identifier (e.g. a serial number) or a reference code (e.g. a bar code) that can be readout and that allows for assigning the respective, previously measured value v1 to the semiconductor component 100.

Figure 35B:
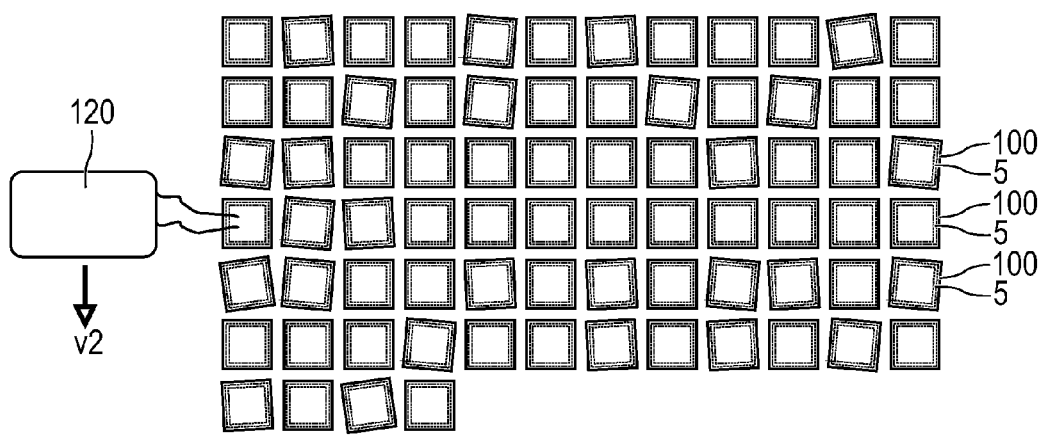
FIG. 35B schematically illustrates determining a value of a characteristic variable of a crack sensor of a single semiconductor component.
Figure 35C:
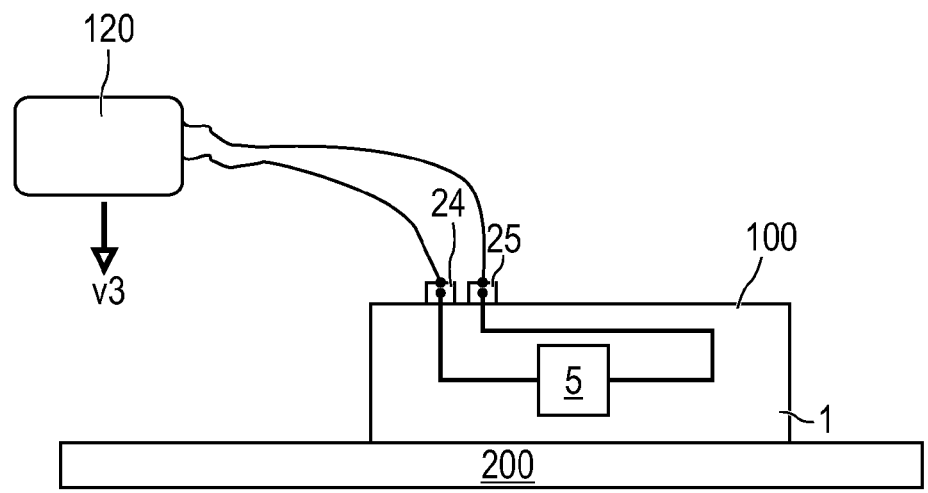
FIG. 35C schematically illustrates determining a value of a characteristic variable of a crack sensor of a semiconductor component that is mounted on a carrier.
Figure 35D:
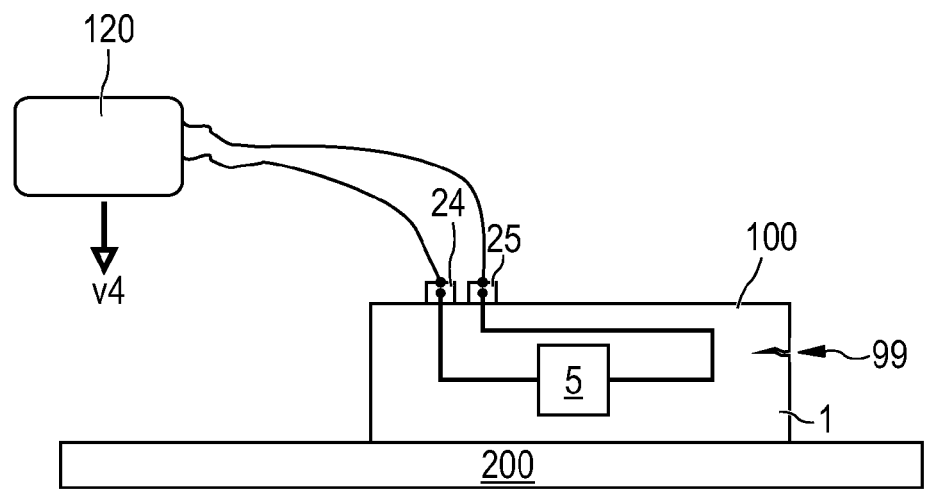
FIG. 35D schematically illustrates determining a value of a characteristic variable of a crack sensor of the semiconductor component of FIG. 35 after a crack had occurred.

FIG. 35B shows the semiconductor components 100 of FIG. 35A after being singulated, e.g. by sawing or any other wafer dicing technique. That is, the semiconductor components 100 now are physically separate individual components. In this state, an evaluation unit 120 may be used to measure a value v2 of the characteristic variable of the crack sensor 5 of one, more than one or all of the semiconductor components 100. Alternatively or in addition to marking the semiconductor components 100 with the respective values v1, the semiconductor components 100 may be individually marked with the respective value v2 and/or an identifier as described above in connection with the value v1.

In embodiments in which a connection line 27 is interrupted (see FIGS. 24 and 25 and the related description), for instance by fusing, interrupting may take place prior to or after measuring the value v2.

In one of the same ways as described with reference to FIGS. 35A and 35B, values v3 and/or v4 of the characteristic variable of the crack sensor 5 of one, more than one or all of the semiconductor components 100 may be determined and assigned to the respective semiconductor component 100 if that semiconductor component 100 is used in an electronic circuit (herein FIG. 35C, for instance, on a lead frame 200), for instance subsequently at different points of time.

In principle, determining the values v1 and/or v2 and/or v3 and/or v4, and optionally assigning those values to the respective semiconductor component 100 may take place at any point(s) of time of the lifetime of a semiconductor component 100. In any case, comparing a change of any two or more values v1, v2, v3, v4 of the same characteristic variable of the crack sensor 5 of the same semiconductor component 100 and taken at different, subsequent points of time allows for an estimation of the probability if there is a crack 99 in the semiconductor body 1 of the respective semiconductor component 100.

For instance, comparing the values v2 (FIG. 35B) and v1 (FIG. 35A) of the same semiconductor component 100 allows for an estimation of the probability if a crack 99 occurred when the semiconductor component 100 was singulated from the wafer 110. Then, comparing the values v3 (FIG. 35C) and v2 (FIG. 35B) of the same semiconductor component 100 allows for an estimation of the probability if a crack 99 occurred after the singulated semiconductor component 100 was integrated in an electronic circuit. Of course, comparing the values v3 (FIG. 35C) and v1 (FIG. 35A) of the same semiconductor component 100 allows for an estimation of the probability if a crack 99 occurred during the process in which the semiconductor component 100 was singulated and subsequently integrated in an electronic circuit. Further, comparing the values v4 (FIG. 35D; no crack 99 in the semiconductor body 1) and v3 (FIG. 35C; no crack in the semiconductor body 1) of the same semiconductor component 100 allows for an estimation of the probability if a crack 99 occurred during the operation of the semiconductor component 100 integrated in an electronic circuit.

The above-described method for determining the probability if a crack 99 occurred in the semiconductor body 1 of a semiconductor component 100 is based on comparing at least two values v1, v2, v3, v4 of the same characteristic variable of the crack sensor 5 of that semiconductor component 100.

However, an estimation of the probability if a crack 99 occurred in the semiconductor body 1 of a semiconductor component 100 is also possible by comparing one measured value v1, v2, v3, v4 with a nominal value that may be determined theoretically based on the production parameters of the respective semiconductor component 100. For instance, in the embodiment of FIGS. 1, 2, 3A and 3B, the resistance (i.e. the characteristic variable) of the resistance region 51 of the crack sensor 5 between the first and second crack sensor electrode pads 24, 25 substantially depends on the circumferential length of the crack sensor 5, the cross-sectional area of the resistance region 51, and the specific electrical resistance of the resistance region 51.

A further possibility for determining a nominal value of a characteristic variable of a crack sensor 5 is to carry out comparative measurements of one or more values of the respective characteristic variable of faultless crack sensors of semiconductor components that are identical to the provided semiconductor component 100. For instance, for a certain type of semiconductor component 100, a nominal value of a characteristic variable of a crack sensor 5 may be determined by measuring the values of the same characteristic variable for a number N of well-working (good) semiconductor components of the same type as the semiconductor component 100, and to use the average of the N values as the nominal value.

In the embodiments described above, freely from outside the semiconductor component 100 accessible first and second crack sensor electrode pads 24 and 25 are used for measuring a value v1, v2, v3, v4 of a characteristic variable of a crack sensor 5 of a semiconductor component 100. However, it is also possible to integrate an evaluation unit 120 that is electrically connected to the crack sensor 5 of a semiconductor component 100 in a common electronic circuit. In such embodiments, the evaluation unit 120 may additionally be used to react in a pre-defined way if there is a certain probability that a crack 99 occurred. Thus, an evaluation unit 120 may optionally be designed to measure a value of the characteristic variable, to determine, based on the measured value, a probability for the occurrence of a crack 99 in the semiconductor body 1. If the determined probability exceeds a pre-defined limit, the evaluation unit 120 may disable the semiconductor component 100 and/or output a warning signal.

Referring now to FIG. 36 there is illustrated a semiconductor component 100 with a crack sensor 5 and an inductor 115 that is electrically connected to the crack sensor 5. The inductor 115 may be fixedly mounted on or monolithically integrated in the semiconductor body 1. An evaluation unit 120 is used to generate an electromagnetic field that allows for a non-contact measurement of a value of a characteristic variable of a semiconductor component 100. As the response of the system with the inductor 115 and the crack sensor 5 depends on the value of the respective characteristic variable, that value may be determined in conventional manner by measuring the response of the mentioned system to the electromagnetic field generated by the evaluation unit 120.

Finally, FIG. 37 illustrates a method for detecting a crack in a semiconductor body of a semiconductor component having a crack sensor.

In a first step 201, a semiconductor component 100 is provided. The semiconductor component 100 has a semiconductor body 1 with a bottom side 12, a top side 11 spaced distant from the bottom side 1 in a vertical direction v, and, in the vertical direction v, a thickness d1. Arranged in the semiconductor body 1 is a crack sensor 5 for detecting the occurrence of a crack 99 in the semiconductor body 1. The crack sensor 5 extends into the semiconductor body 1. A distance d2 between the crack sensor 5 and the bottom side 12 is less than the thickness d1 of the semiconductor body 1.

In a second step 202, a first value of a characteristic variable of the crack sensor 5 is specified. For instance, as described above with reference to FIGS. 35A to 35D, the first value may be a previously measured value of the same characteristic variable of the same crack sensor 5 of the same semiconductor component 100, or a nominal value that depends on the type of the respective semiconductor component 100.

In a third step 203, a second value of the characteristic variable of the crack sensor 5 is determined prior to or after specifying the first value.

In a fourth step 204, the semiconductor body 1 is identified to have a crack 99 if the second value differs from the first value by more than a pre-defined difference.

It is to be noted that if the first value is a nominal value, i.e., a value that is based on a calculation or on comparative measurements on other semiconductor components 100 of the same type, the order of specifying the first value (step 202) and of determining the second value (step 203) is arbitrary, and, in this case, specifying the first value may take place after but even before or simultaneously with step 201.

An example for that method will now be explained for a semiconductor component 100 having a crack sensor 5 with a resistance region 51 and a dielectric 52, as, for instance, illustrated in FIGS. 3A, 3B, 4A, 4B, 18, 19 and 20. If the resistance region 51 has, for instance, in a first measurement a resistance of 10Ω ("first value"), and in a subsequent second measurement a resistance of 1 MΩ ("second value"), then there is a very high probability that a crack 99 completely interrupted the resistance sensor 51.

If, however, in the subsequent second measurement the resistance of the resistance region 51 does not significantly exceed the first value (e.g. second value=15Ω), there is probability that a crack 99 affecting the resistance sensor 5 is developing in the semiconductor body 1. If the resistance in further measurements increases, there is a reasonable probability that there is a crack 99 growing in the semiconductor body 1.

The same principle applies if the leakage current of a diode with a pn-junction 57 as illustrated in FIGS. 4A, 4B, 6A, 6B, 21, 22 and 23 is used as characteristic variable of the crack sensor 5. In this case, however, a growing crack will lead to an increase of the measured value, i.e. the pn-junction is partially shortened by the crack and the corresponding leakage current significantly increases.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents. In particular, the features/method steps of different embodiments may be combined in an arbitrary manner unless the combination of certain features/method steps is technically impossible.

What is claimed is:

1. A semiconductor component, comprising:
   a semiconductor body having a bottom side, a top side spaced distant from the bottom side in a vertical direction, and a thickness in the vertical direction; and
   a crack sensor configured to detect a crack in the semiconductor body,
   wherein
      the crack sensor extends into the semiconductor body,
      a distance between the crack sensor and the bottom side is less than the thickness of the semiconductor body,
      the crack sensor is partially or completely arranged in a trench formed in the semiconductor body.

2. The semiconductor component as claimed in claim 1, wherein the distance between the crack sensor and the bottom side is less than 80% of the thickness of the semiconductor body.

3. The semiconductor component as claimed in claim 1, wherein the crack sensor is electrically connected to one or both of:
   a first crack sensor electrode pad arranged on the semiconductor body; and
   a second crack sensor electrode pad arranged on the semiconductor body.

4. The semiconductor component as claimed in claim 3, wherein:
   the first crack sensor electrode pad is arranged on the top side and the second crack sensor electrode pad is arranged on the bottom side; or
   both the first crack sensor electrode pad and the second crack sensor electrode pad are arranged on the top side.

5. The semiconductor component as claimed in claim 3, further comprising a first main electrode pad arranged on the semiconductor body and a second main electrode pad arranged on the semiconductor body, wherein the first crack sensor electrode pad is spaced distant from both the first main electrode pad and the second main electrode pad.

6. The semiconductor component as claimed in claim 5, wherein a load path is formed between the first main electrode pad and the second main electrode pad, and wherein:
   the first main electrode pad is an anode electrode pad and the second main electrode pad is a cathode electrode pad; or
   the first main electrode pad is a cathode electrode pad and the second main electrode pad is an anode electrode pad; or
   the first main electrode pad is a source electrode pad and the second main electrode pad is a drain electrode pad; or
   the first main electrode pad is a drain electrode pad and the second main electrode pad is a source electrode pad; or
   the first main electrode pad is an emitter electrode pad and the second main electrode pad is a collector electrode pad; or
   the first main electrode pad is a collector electrode pad and the second main electrode pad is an emitter electrode pad.

7. The semiconductor component as claimed in claim 3, further comprising a first main electrode pad arranged on the semiconductor body and a second main electrode pad arranged on the semiconductor body, wherein the first crack sensor electrode pad is identical with either the first main electrode pad or the second main electrode pad.

8. The semiconductor component as claimed in claim 7, wherein a load path is formed between the first main electrode pad and the second main electrode pad, and wherein:
   the first main electrode pad is an anode electrode pad and the second main electrode pad is a cathode electrode pad; or
   the first main electrode pad is a cathode electrode pad and the second main electrode pad is an anode electrode pad; or
   the first main electrode pad is a source electrode pad and the second main electrode pad is a drain electrode pad; or
   the first main electrode pad is a drain electrode pad and the second main electrode pad is a source electrode pad; or
   the first main electrode pad is an emitter electrode pad and the second main electrode pad is a collector electrode pad; or
   the first main electrode pad is a collector electrode pad and the second main electrode pad is an emitter electrode pad.

9. The semiconductor component as claimed in claim 1, wherein the crack sensor comprises a resistance region made of a resistive material and a dielectric arranged between the resistance region and the semiconductor body.

10. The semiconductor component as claimed in claim 9, wherein the resistive material is a doped polycrystalline semiconductor material.

11. The semiconductor component as claimed in claim 9, wherein the resistive material has a specific electrical resistance of less than 0.005 Ohm·cm.

12. The semiconductor component as claimed in claim 1, wherein the crack sensor comprises a pn-junction formed between a first diode zone and a second diode zone.

13. The semiconductor component as claimed in claim 12, wherein the first diode zone is a drift zone.

14. The semiconductor component as claimed in claim 1, wherein the crack sensor is an open or closed ring that surrounds an electronic structure monolithically integrated in the semiconductor body.

15. The semiconductor component as claimed in claim 14, wherein the crack sensor surrounds, in a cross-sectional plane perpendicular to the vertical direction and in the open ring, a point located in the cross-sectional plane over an angle of at least 330°.

16. The semiconductor component as claimed in claim 1, wherein the thickness of the semiconductor body is determined by one or both of the following criteria:
   (a) the thickness of the semiconductor body is the maximum thickness the semiconductor body has in the vertical direction; and
   (b) the thickness of the semiconductor body is determined along a first straight line running in the vertical direction, the distance between the crack sensor and the bottom side is determined along a second straight line running in the vertical direction, and a distance between the first straight line and the second straight line is less than 100 µm or less than 20 µm.

17. A semiconductor component, comprising:
a semiconductor body having a bottom side, a top side spaced distant from the bottom side in a vertical direction, and a thickness in the vertical direction; and
a crack sensor configured to detect a crack in the semiconductor body,
wherein
the crack sensor extends into the semiconductor body,
a distance between the crack sensor and the bottom side is less than the thickness of the semiconductor body, and
the crack sensor comprises a resistance region made of a resistive material and a dielectric arranged between the resistance region and the semiconductor body.

18. The semiconductor component as claimed in claim 17, wherein the crack sensor is partially or completely arranged in a trench formed in the semiconductor body.

\* \* \* \* \*